US006601232B1

(12) United States Patent
Burba et al.

(10) Patent No.: US 6,601,232 B1
(45) Date of Patent: Jul. 29, 2003

(54) APPARATUS AND METHOD FOR CREATING AND DOCUMENTING PROCEDURES

(75) Inventors: Earl E. Burba, Morrison, CO (US); Jon Duncan Hagar, Littleton, CO (US)

(73) Assignee: Lockheed Martin Corporation, Bethesda, MD (US)

( * ) Notice: Subject to any disclaimer, the term of this patent is extended or adjusted under 35 U.S.C. 154(b) by 0 days.

(21) Appl. No.: 09/486,445
(22) PCT Filed: May 4, 1999
(86) PCT No.: PCT/US99/09716
§ 371 (c)(1), (2), (4) Date: Feb. 25, 2000
(87) PCT Pub. No.: WO99/57633
PCT Pub. Date: Nov. 11, 1999

Related U.S. Application Data
(60) Provisional application No. 60/084,028, filed on May 4, 1998.

(51) Int. Cl.[7] .................................................. G06F 9/44
(52) U.S. Cl. ..................... 717/100; 717/101; 707/200
(58) Field of Search ................................. 717/106, 176, 717/171, 200, 100, 101, 114, 116; 707/500, 513, 200

(56) References Cited

U.S. PATENT DOCUMENTS

| 5,610,828 | A | | 3/1997 | Kodosky et al. ............ 364/489 |
|---|---|---|---|---|
| 5,724,556 | A | | 3/1998 | Souder et al. .............. 395/500 |
| 5,815,712 | A | | 9/1998 | Bristor et al. ............... 395/701 |
| 5,842,020 | A | | 11/1998 | Faustini ....................... 395/701 |
| 5,911,075 | A | * | 6/1999 | Glaser et al. ................ 717/100 |
| 5,915,113 | A | | 6/1999 | McDonald et al. .......... 395/702 |
| 5,924,109 | A | | 7/1999 | Ackerman et al. ........... 707/531 |
| 6,035,119 | A | * | 3/2000 | Massena et al. ............. 717/100 |
| 6,044,398 | A | * | 3/2000 | Marullo et al. .............. 709/219 |
| 6,067,639 | A | * | 5/2000 | Rodrigues et al. ............. 714/38 |
| 6,257,774 | B1 | * | 7/2001 | Stack ........................... 717/100 |
| 6,408,311 | B1 | * | 6/2002 | Baisley et al. ............... 707/203 |

OTHER PUBLICATIONS

Ricca et al, Analysis and esting of web applications IEEE, pp 25–34, 2001.*
Boyapati et al, "Korat; Automated testing based on Java predicates", ACM pp 123–133, 2002.*

(List continued on next page.)

Primary Examiner—Anil Khatri
(74) Attorney, Agent, or Firm—Marsh Fischmann & Breyfogle LLP

(57) ABSTRACT

A system and method are employed for the creation of test procedures. Through use of a data network (12), remotely located users may access the system and either retrieve existing test procedures or create new ones. Further, the system provides the capability to combine new procedures with pre-existing templates. The system may provide a number of sections (44–60) in which a system user may enter information for creating a test procedure. Further functions are provided to edit test procedure (32), copy, rename or delete test procedures, as well as submit a test procedure (38) for approval. Following acceptance and approval (40) of the test procedure the facility to execute the procedure exists. The system user enters the required information into the fields provided in the automated procedure and executes the procedure documenting each step and entering notes or flag information during the interactive session. The results are documented and time tagged for later review and acceptance by the appropriate parties.

24 Claims, 37 Drawing Sheets

OTHER PUBLICATIONS

Nimmer et al, "Automatic generation of program specifications", ACM pp 229–239, 2002.*

Mercury Interactive, TestDirector, Jan., 1998 [retrieved Aug. 14, 2002]. Retrieved from the internet: <URL:http://web.archive.org/web/19980117174456/www.merc–int.com/products/testdirector4/>.*

Peter Hansen; The World Wide Web Leads a Revolution in ATE Programming Environments; Jul. 1997.

Jay Johansen; Template–Drive Web Pages; Nov. 1997.

W. Balasubramanian, Bang Min Ma, Joonhee Yoo; A Systematic Approach to Designing a WWW Application; Aug. 1995.

Anne Knowles; Second Wave Java Tools Tuned to Perform; Dec. 1996.

Peggy Watt; Web Development Tools Enter the Next Generation; Dec. 1996.

* cited by examiner

LOCATION: http://ivvsun2.ast.lmco.com/ivv/tools/demo_tools/EELV/EELV.html

Menu

- Open
- Create
- Edit
- CRD
- Submit
- Approve 2.0 Data Section

Enter Data that may be needed to execute the test (i.e., data decks, data files, or any other stimuli): 86

Enter a description of the expected output and its location: 88

To submit the Data section, Press this Button: [Submit]

to Clear, Press: [Reset]

Create a New Procedure

FIG.16

Electronic Procedure Acceptance Mail Message Form Requested

Authentication

Procedure URL:

/www/pages/ivv/tools/demo_tools/EEL

Enter your personal Password:

••••

Procedure Identifier:

Accept_FM-1.html

Procedural Approval Type:

Template Review ▽

| Section | Approval | Comments |
|---|---|---|
| 1.0 Objectives | ⊙ Approved<br>○ Rejected | Notes 1 |
| 2.0 Testbed Requirements | ○ Approved<br>⊙ Rejected | Notes 2 |
| 3.0 Special Considerations | ⊙ Approved<br>○ Rejected | Notes 3 |
| 4.0 Output Requirements | ○ Approved<br>⊙ Rejected | Notes 4 |
| to submit, Press: Submit | | |

Menu

- Open
- Create
- Edit
- CRD
- Submit
- Approve

FIG.36

3.0 Procedural Section 3.1 Description
A real Description

| Action | Response |
|---|---|
| 3.1.1 Action<br>Action 1 | 3.1.1.1 Response<br>Response 1 |
| 3.1.2 Action<br>Action 2 | 3.1.2.1 Response<br>Response 2 |
| 3.1.3 Action<br>Action 3 | 3.1.3.1 Response<br>Response 3 |
| Enter flag data in the space provided: | QA Approval<br>◉ Passed<br>○ Failed |

To submit this Procedural Section, Press this Button: [Submit]
to Clear, Press: [Reset]

Menu
- Open
- Create
- Edit
- CRD
- Submit
- Approve

FIG. 37

APPARATUS AND METHOD FOR CREATING AND DOCUMENTING PROCEDURES

This application claims the benefit of Provisional application Ser. No. 60/084,028 filed May 4, 1998.

FIELD OF THE INVENTION

The invention described herein relates to an automated system and method for generating, executing, and documenting software test and work procedures, and in particular to a world wide web-based tool which may be accessed remotely and employed to automatically generate existing or customized procedures.

BACKGROUND OF THE INVENTION

Test procedures are a tool employed by many business entities to assess the performance of products which they manufacture. In short, a company while developing a product, and especially one that is technically complex, will employ test procedures to gauge the performance, functionality, quality, and reliability of the components which make up the product, as well as the product itself. The test procedure may be as simple as measuring the signal level from the output of an electronic device, or may be as complicated as generating and monitoring the occurrence of a complex series of events in a particular environmental setting. A desired feature of test procedures may be that they are standardized across a particular entity like a company, and easy to access and execute.

Another tool which companies may employ with regards to internal communications are data networks such as the World Wide Web (WWW) or a local area network (LAN). Through use of the data network, parties at remote locations may access information at other locations. One advantage of this type of communication is the ability to manipulate the information, accessed, rather than just view it, using the standard protocols of the WWW.

One tool commonly employed in using the World Wide Web is hypertext mark-up language (HTML). This language is a simple mark-up system used to create hypertext documents which are portable from one platform to another. HTML provides the capability to create links with other HTML documents. If the name of a document is highlighted in hypertext form, all that is required to access this document is the movement and activation of a cursor device. Because HTML is the standard language used on the World Wide Web, no conversion or translation is required when moving from Web site to Web site.

SUMMARY OF THE INVENTION

The inventors have recognized that data networks such as the WWW, and HTML, may be a tool employed to automate the generation of test procedures. Further, the inventors have recognized that through the WWW, access may be granted to test procedures which already exist, or custom test procedures may be created through use of a single centralized system.

The invention described herein may include a central processing device such as a server which may be connected to a data network used by remote client systems to access the server. The data network may be the World Wide Web (WWW) or a local area network (LAN) which serves a limited number of remotely located user interfaces using HTML based protocols. Included in the processing device may be a number of processing modules which perform a number of functions in response to information and command signals received over the data network. Also connected to the processing device may be a memory storage which includes a number of pre-existing test procedures as well as a number of HTML template forms which may be presented to the system users who establish a connection over the data network.

The forms may have been created in HTML or supporting language interfaces such that users who access the system may view and enter information through the dialog boxes provided. Further, the forms as screen displays may be included in the HTML which provide for the linking to other HTML documents presently stored in memory.

In order to create new procedures and perform administrative tasks with regards to procedures stored in memory, the processing modules included in the processing device may be individually activated by a system user. One user selectable processing module may include an open function which allows the system user to view procedures titles for documents contained in memory, and then select and view the contents of such documents. Another user selectable function may include a create procedure module through which a system user may create a new procedure either through use of pre-existing templates stored in memory, or through the entry of information in the forms provided.

Yet another user selectable function may be an edit function which allows a system user to access a particular procedure previously generated and edit the contents of the procedure. Steps performed during the edit function may include the same as those performed during the create procedure function. Yet another user selectable function may be the copy, rename, or delete function. Through use of this function, procedures may be copied to create a new procedure, renamed to have a different reference name and/or deleted. In the case of copy or rename all internal references are updated to be consistent with the change in reference name. Procedures, or portions thereof, may be copied, renamed, and/or deleted.

In situations where a system user may have created a custom procedure, a function for submitting the custom procedure for approval may also be included. Upon completion of a procedure, the system user may select a list of names to which to transmit the procedure. Upon receipt of the custom procedure by the selected parties, the same parties may then through use of an approval function review the procedure and either approve or disapprove of it.

In one aspect of the invention, while employing the create function described above, a system user may have the option of creating a custom procedure or may create a new procedure employing pre-existing templates stored in memory. In the situation where the system user wishes to employ pre-existing templates, upon access to the system, a number of selections may be provided to the system through an HTML form. The system user may enter information about the procedure and make selections from the form regarding the content of the procedure. Based on the selections made and the information provided a new procedure is generated. This newly created procedure is stored in a directory and is accessible by other system users.

In the situation where a custom procedure is to be created, while employing the create function, forms may be presented to the system user which provide for the entry of information. Design selections may be presented to the system user of entry of additional information. Forms may also be provided for entering the specific steps to be performed during the new procedure. During this portion of the design associations with other pieces of relevant information may be created. Upon the completion of the entry of information, the system combines the information entered into a new procedure. The custom procedure may then be submitted to a selected number of other parties for review and approval.

In one aspect of the invention, the custom portion of the create function may be divided into a plurality of distinct areas. One area may include an environment section which provides for the entry of information relating to an item or element being tested as well as any other tools employed for this purpose. Another section may be employed to enter data or information which may be required in order to perform the tests. In a procedural section, a system user may enter the individual steps and associate information which may be employed while performing the steps. Another section may be employed to define expected results and engineering analysis there of, to determine success or failure of tests. In another section, associations may be created between the custom procedure being created with other relevant information such as other documents or test reports which may be employed therein. Further with regards to the custom created procedure, the system user may be provided the option to access and employ pre-existing templates and combine these with custom procedures.

In order to implement the system provided herein, the processing device may store the pre-existing templates and interfaces as HTML documents or HTML forms. When a system user, through the data network accesses the processing device, an HTML form may be accessed and displayed. The system user may use such interface devices such as keyboard mouse to enter and manipulate data appearing on the forms. Once sufficient information has been entered into a particular form, a submit button or key may be depressed using the interface devices and the processing device may perform the necessary process in order to create the new procedure. The new procedure may be an HTML document which is viewable and executable over the date network using a Web browser. In creating the procedure the system may create a number of individual HTML documents to create the final procedure.

Once a procedure has been created, the system described herein may further include the functionality to execute the newly created test procedure, or any test procedure which may be stored in memory. Once a procedure is accessed, a system user may enter the information into fields provided in the automated procedure and execute the procedures documenting each step and entering notes or flag information during an interactive session. The results may be documented and time tagged for later review and acceptance by the appropriate parties. dr

BRIEF DESCRIPTION OF THE DRAWINGS

FIG. 12 discloses a display for navigation of the procedure once it has been created and selecting a particular section of the procedure to begin work on.

FIG. 16 discloses a screen display which is presented for entry of information in section no. 2.

FIG. 36 discloses a screen display which provides a form for reviewing and either approving or disapproving of a procedure.

FIG. 37 discloses a screen display which provides for entry of information during execution of a procedure.

DETAILED DESCRIPTION

Figure 1:
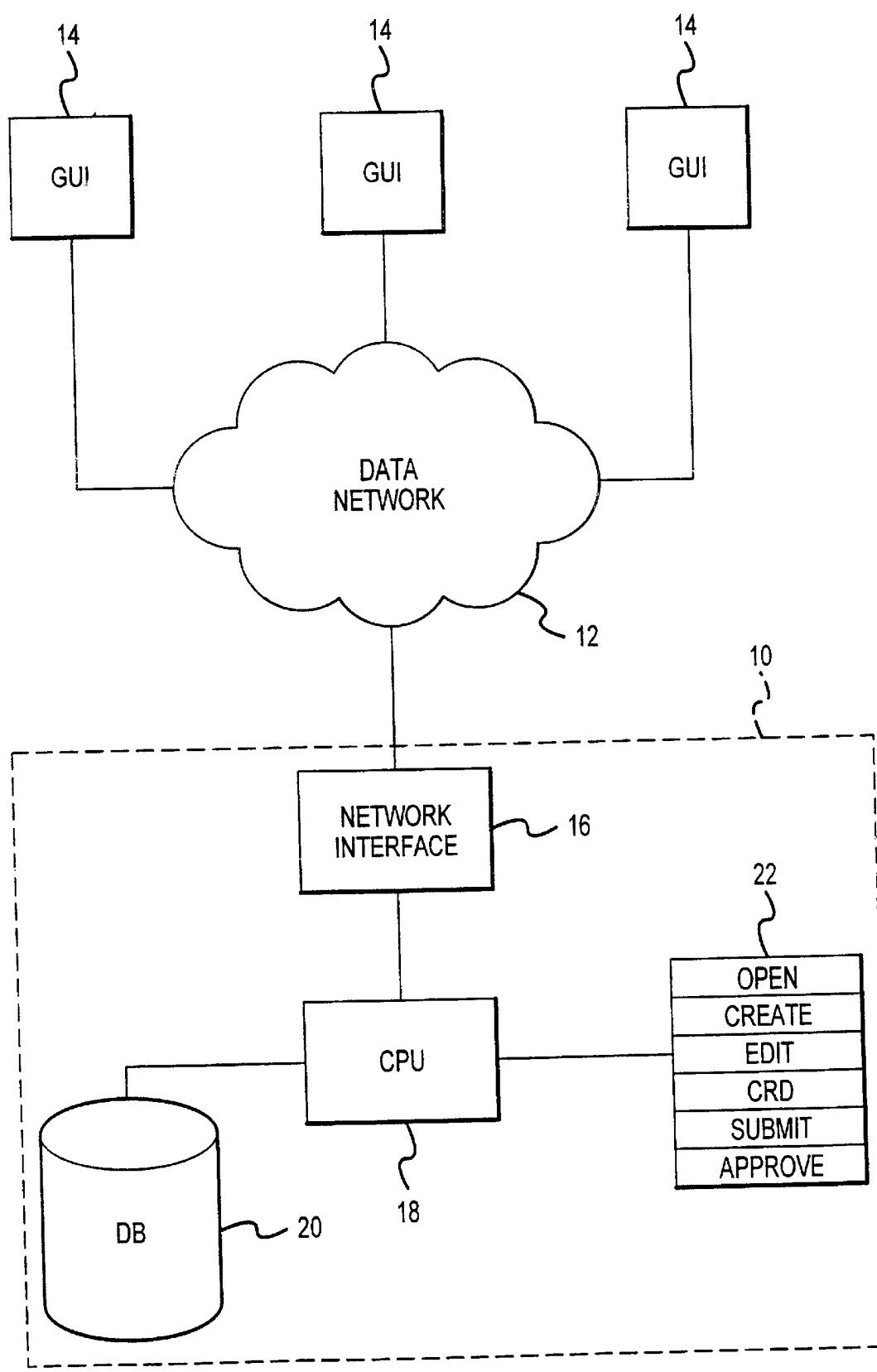
FIG. 1 discloses a system diagram for the invention described herein.

Disclosed in FIG. 1 is a system diagram for the automated procedure creating system described herein. A processing device 10 such as a network server is connected to a data network 12. The data network 12 may be the World Wide Web (WWW) or may be a smaller network such as a local area network (LAN). The network server may exist on a sun/solaris UNIX WWW server (such as Sun/solaris, NT, or other operating system) platform which can distribute information to Macintosh, PC, and other client machines. The server software may consist of several zero cost applications namely W3C httpd (formerly CERN httpd) 3.0 or commercial off the shelf WWW applications (such as FASTtrack) and a few support tool that assist with maintenance and enhance the server capabilities (i.e. common gateway interface (CGI parsing)). The server may reside behind a corporate firewall for information security and may be equipped with two additional methods of information protection, i.e. password and machine recognition, to further restrict access of selected document pages to only particular parties. The server may have the capability to distribute documents from a variety of popular commercial software. The server may also support image maps (clickable pictures) and a usage meter that informs the project as to who is accessing the pages and what areas are far more frequently accessed. Information distributed from the server can be received from most networks computer platforms. Finally, the server may have the capability to execute CGI scripts.

Also connected to the data network 12, are user interfaces 14. According to the invention, these client implementations may include Macintosh, PC, and UNIX and other operating system work stations using a Web browser such as Netscape, Mosaic and Internet Explorer. Through use of this multi-platform server and client, all standard Web documents (HTML/CGI) and many popular commercial applications (Microsoft Office, ETC.) can be distributed seamlessly from any Web server to any Web client. Thus information of these tools can be achieved without extensive effort.

Incorporated into the server 10 are a number of elements. The first element may be the network interface 16 which provides for the transmission and receipt of data signals over the data network. This interface may be a corporate firewall or other similar interface device. The central processing unit 18 directs all signals transmitted within the server 10 and performs all necessary operations for the function of the system. In connection with the processor is memory 20 which includes all the documents and templates employed by the system for generation of the procedures. Also in connection with the processor 18 are processing modules 22 which are employed by the processor to perform the individual functions performed by the system. These functions will be described in greater detail below.

The system described herein relates to test procedures developed for testing products and systems. Testing practice has usually included the use of written and controlled test procedures (step-by-step test descriptions detailing inputs, environment, output, and success criteria). Test procedures are planned, developed, reviewed and documented to provide programmatic support throughout the life cycle of a product or system. Also test procedures define such things as test objects, references, special considerations, execution steps, analysis methods and ultimately, pointers to "as-run" results. Historically, test procedures were large hardcopy documents.

The present system provides a method and apparatus for speeding up the generation of test procedures, test execution and documentation, as well as approval by parties such as engineering, management and quality assurance. As part of the system described herein, various HTML templates and forms have been created that allow first the generation of specific test cases and then the execution of tests using the completed HTML-test based procedure in an on-line, interactive mode. This approach highly automates and standardizes test procedure generation and execution which is known as software test and evaluation procedure (STEP). Tests are designed by filling in each HTML template form which in turn generate test procedures in the form of other HTML documents. In the present system all test inputs and outputs, Unix shell files and the STEP itself are stored in a specific location for view and analysis by selected parties after a run. As fields are entered, the system builds a new HTML file that is itself an executable test procedure. In order for the user to process smaller pieces of the STEP, the tool offers the feature of partial submittables at the end of logical sections of the test procedure. The user can then exit the browser and begin generation of later test procedure sections at a subsequent time. This supports the test design over a number of sections or designers. Custom and predesigned procedures can be mixed freely with order independence.

When completed, test procedures may be submitted for electronic on-line review and approval. Once approved for use, the test procedure file can be executed via that data network. Test procedures may prompt testers for actions interactively and spawn actual test tool execution as well as providing for the input and output retention.

The procedure generation tool itself is designed to provide a system user with a friendly interface and minimize the interface between user and tools wherever appropriate. The entry page allows the user to review the tool requirements documentation and/or on-line help. There is also a menu that permits the user to open an existing STEP, create a new STEP, edit an existing STEP, change, replace, or delete an existing STEP, submit a STEP for approval, or approve a STEP for execution. The user navigates through the tool graphically entering information based on individual user needs.

In operation a system user, through the data network, will establish a connection with the network server. Upon establishment of this connection, a display page such as that shown in FIG. 2 may be presented. Through this display page, a number of the functions performed by the system may be accessed. As described above, access may be gained to the server using a commercially available Web Browser and information may be manipulated employing the functions incorporated into said Web Browser. With regards to the procedure generating system described herein, the main page shown in FIG. 2 includes a number of interactive device, buttons, which the system user may select to activate particular functions.

In particular, the open button 30 once selected, allows a system user to choose a procedure already stored on the system. The create button 32 when selected provides for the creation of a new STEP. The edit button 34 when selected provides for the edit of an existing STEP. The change, replace, or delete (CRD) button 36 allows a system user to perform these functions with regards to an existing STEP. The submit button 38 provides for the submission of a STEP to a review process. The approve button 40 provides for the review and approval of STEPS created by the system. Also included on the main display page are a number of different options which when selected provide assistance to a system user with regards to operation of the system.

Figure 3:
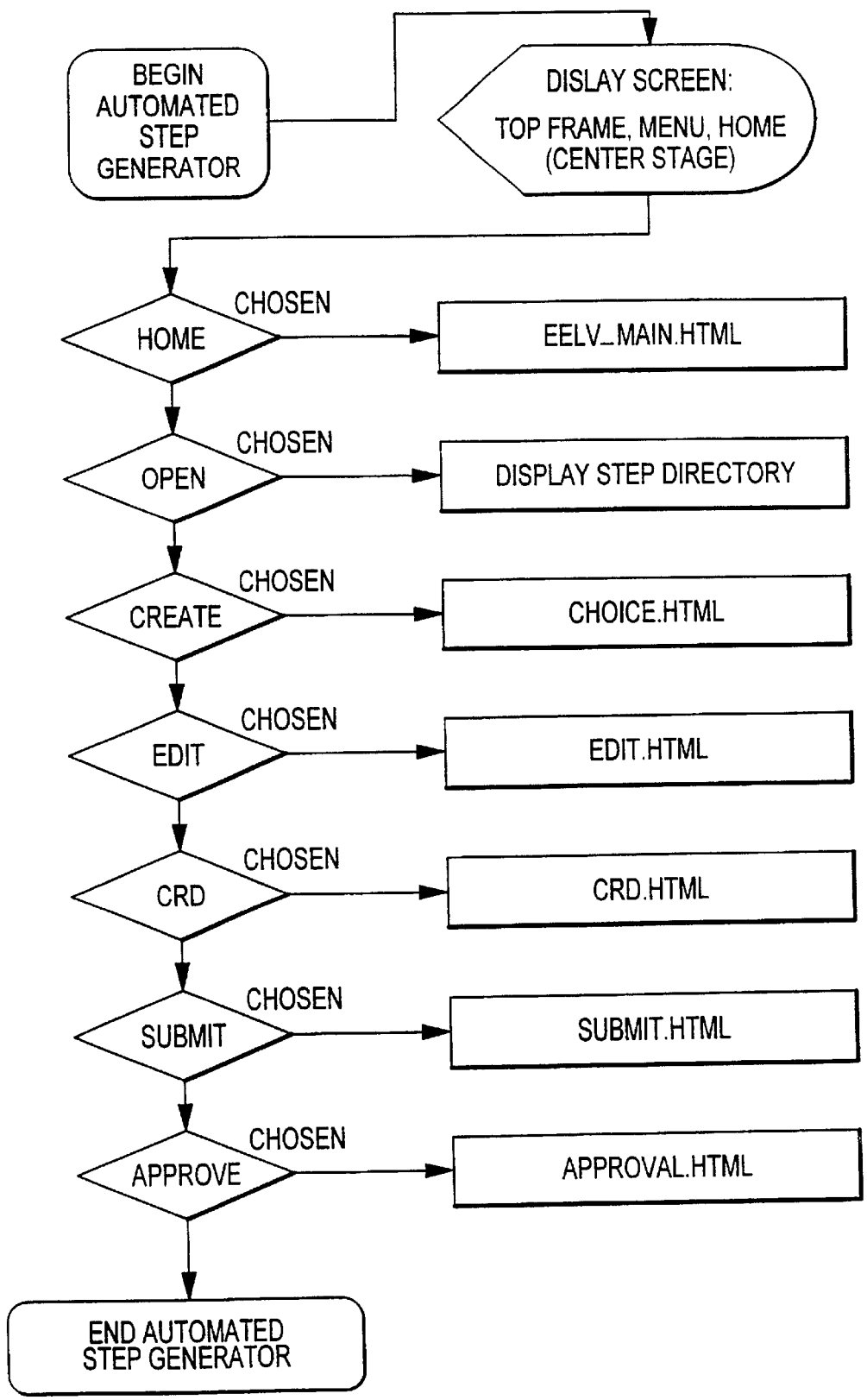
FIG. 3 discloses a flowchart which describes the selection process for the functions performed by the procedure generating system.
Figure 4:
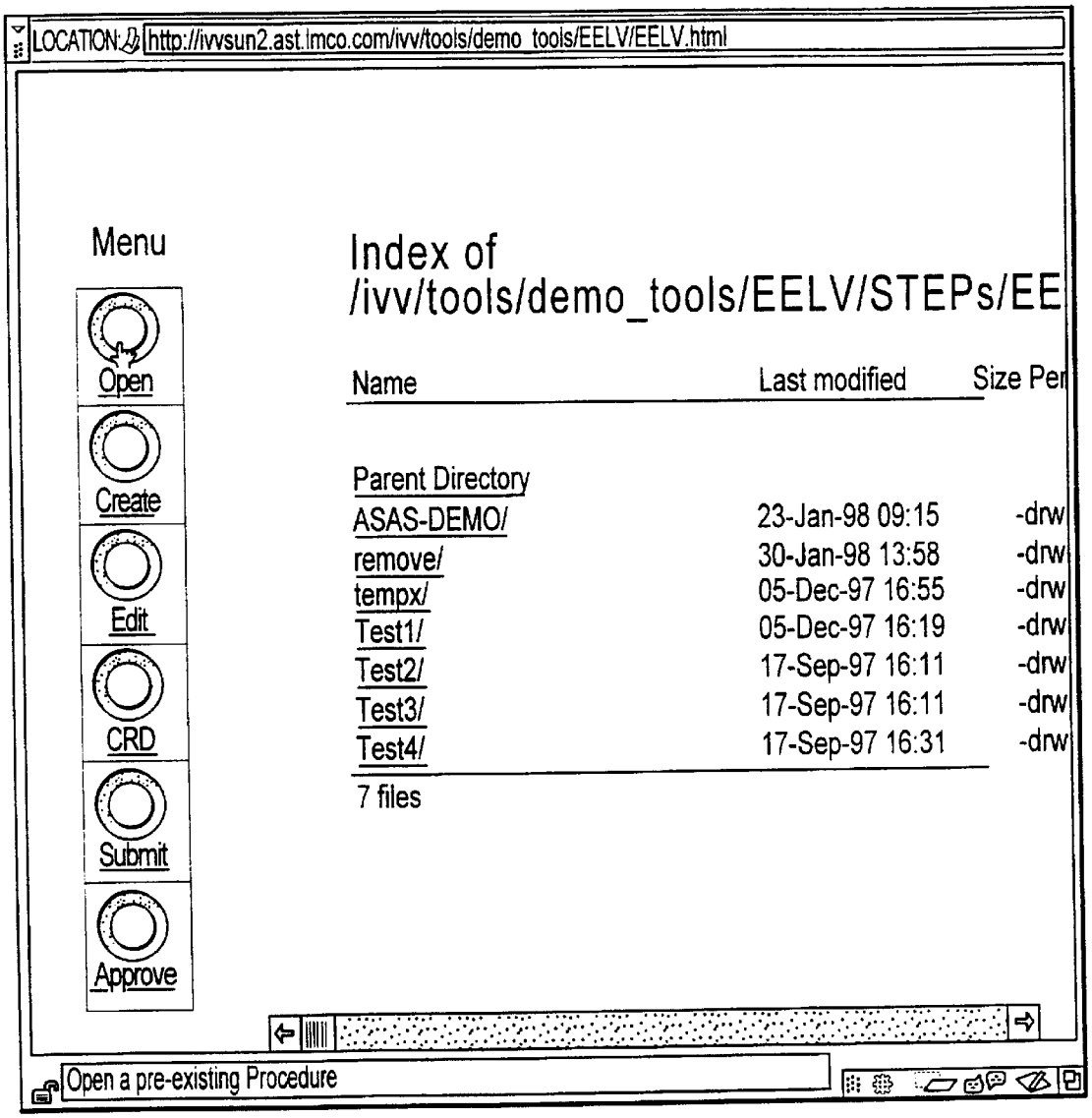
FIG. 4 discloses a directory of procedures templates which are stored in memory.

Disclosed in FIG. 3 is a flowchart which describes the operational STEPS of the system when any of the control buttons on the page are selected. As can be seen, upon selection of either the open, create, edit, CRD, submit or approve button, the system user via the screen display will be directed to a HTML page relating to that particular topic. In the situation where the system user selects the open button 30, the display screen disclosed in FIG. 4 is presented. As described, the open button allows a system user to access and view any procedures previously created. As is seen, each procedure is given a title or identifier and through use of the cursor device, a particular procedure may be selected and its contents displayed. The buttons 30–40 appear on every screen display presented to the system user as a separate frame. Through selection of these buttons, the other functions may be activated. If the system user does wish to return to the main page this may be done either through use of the "back" button incorporated into most commercial Web Browsers or selection of the "home" button if the main page is designated as the home page for that particular system user.

Figure 5:
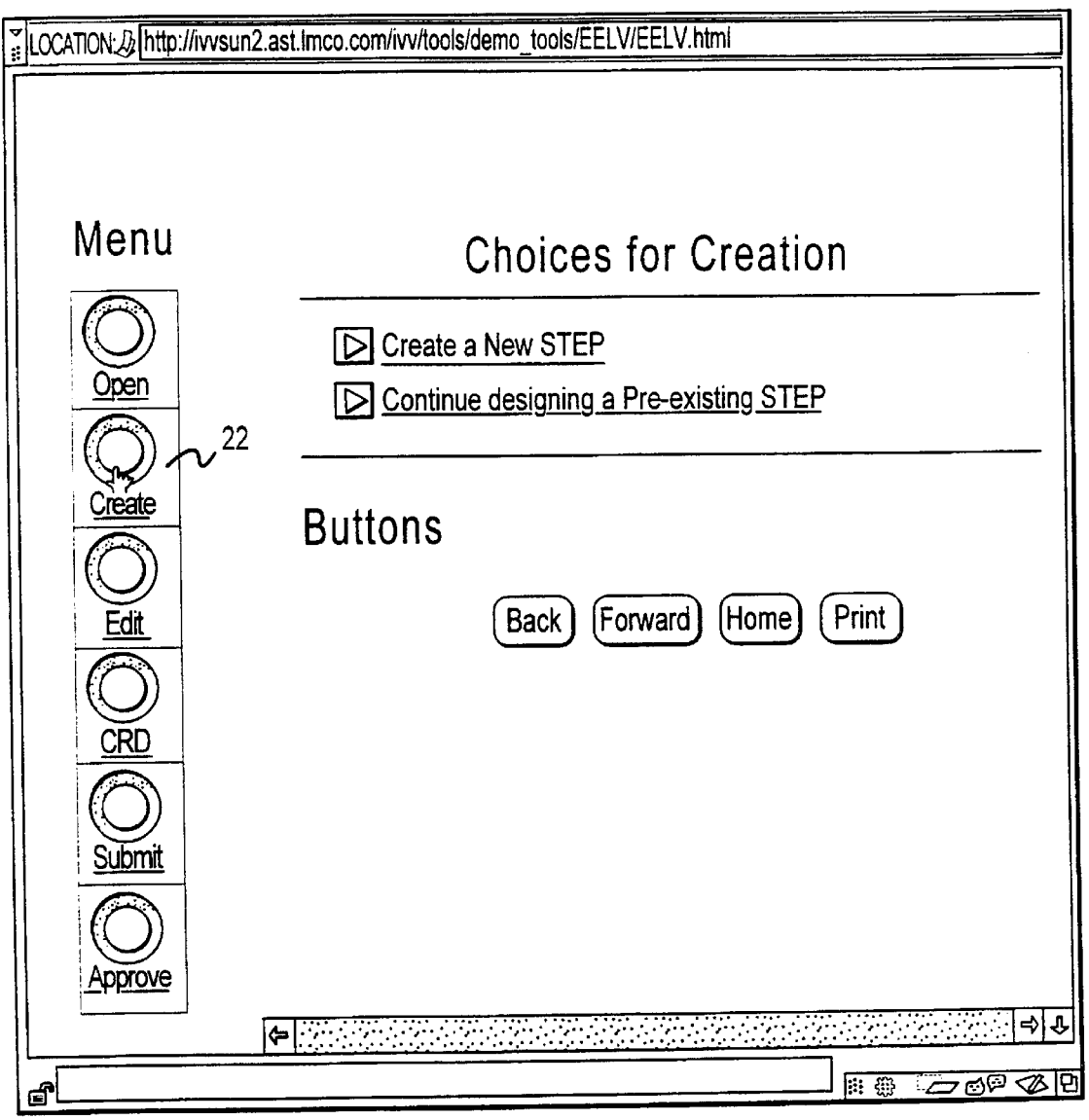
FIG. 5 discloses a screen display presented upon selection of the create function.
Figure 6:
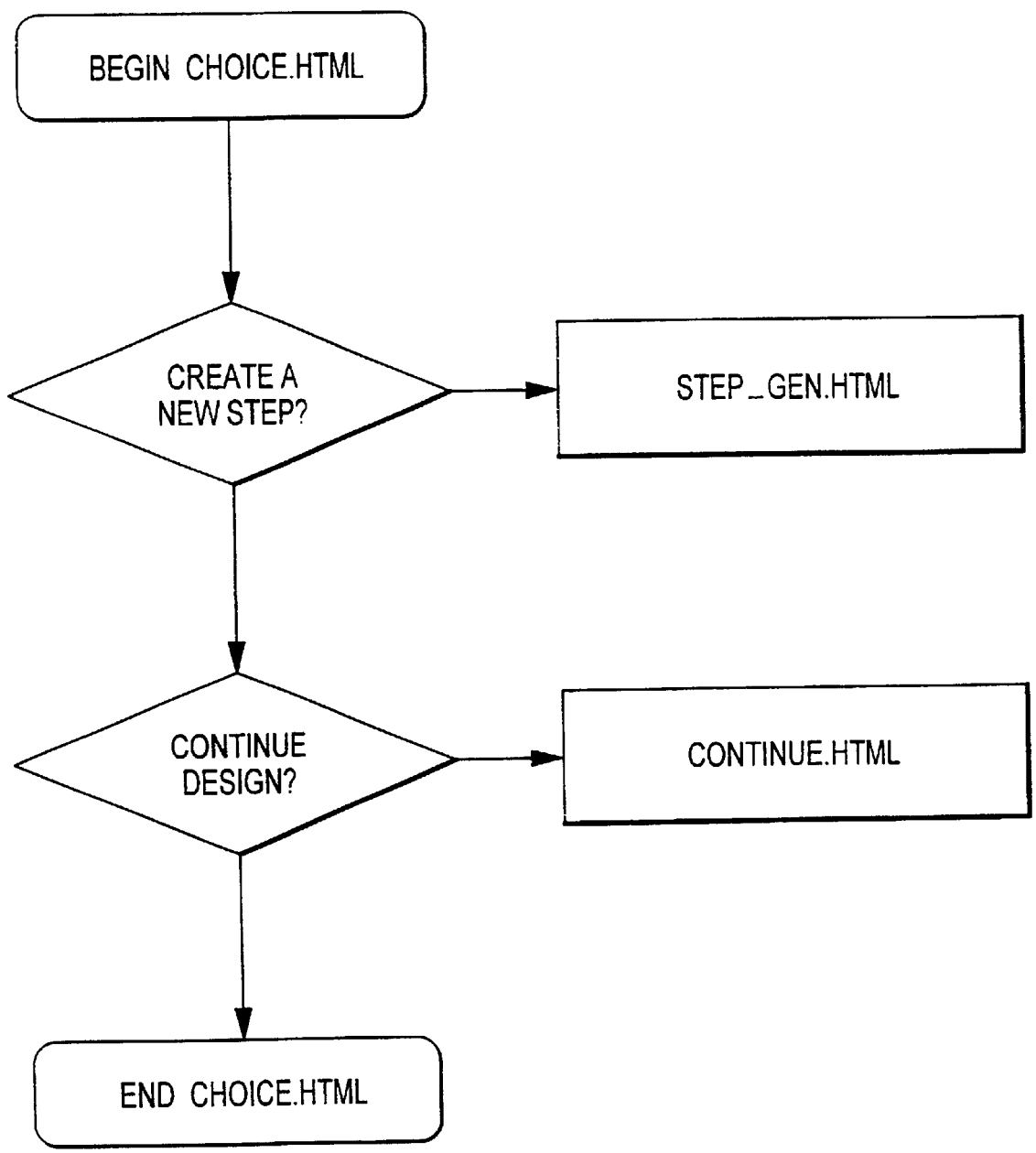
FIG. 6 discloses a flowchart which describes the selection of the create function.

If the system user wishes to activate the create function, then button 32 is selected. Upon the selection, the screen display disclosed in FIG. 5 is presented. The system user has the choice of choosing between creating a new STEP or continuing the design of a pre-existing STEP. The flowchart disclosed in FIG. 6 describes the steps performed by the system upon selection of either the creation of a new STEP or the continuing design of a pre-existing STEP.

Figure 7:
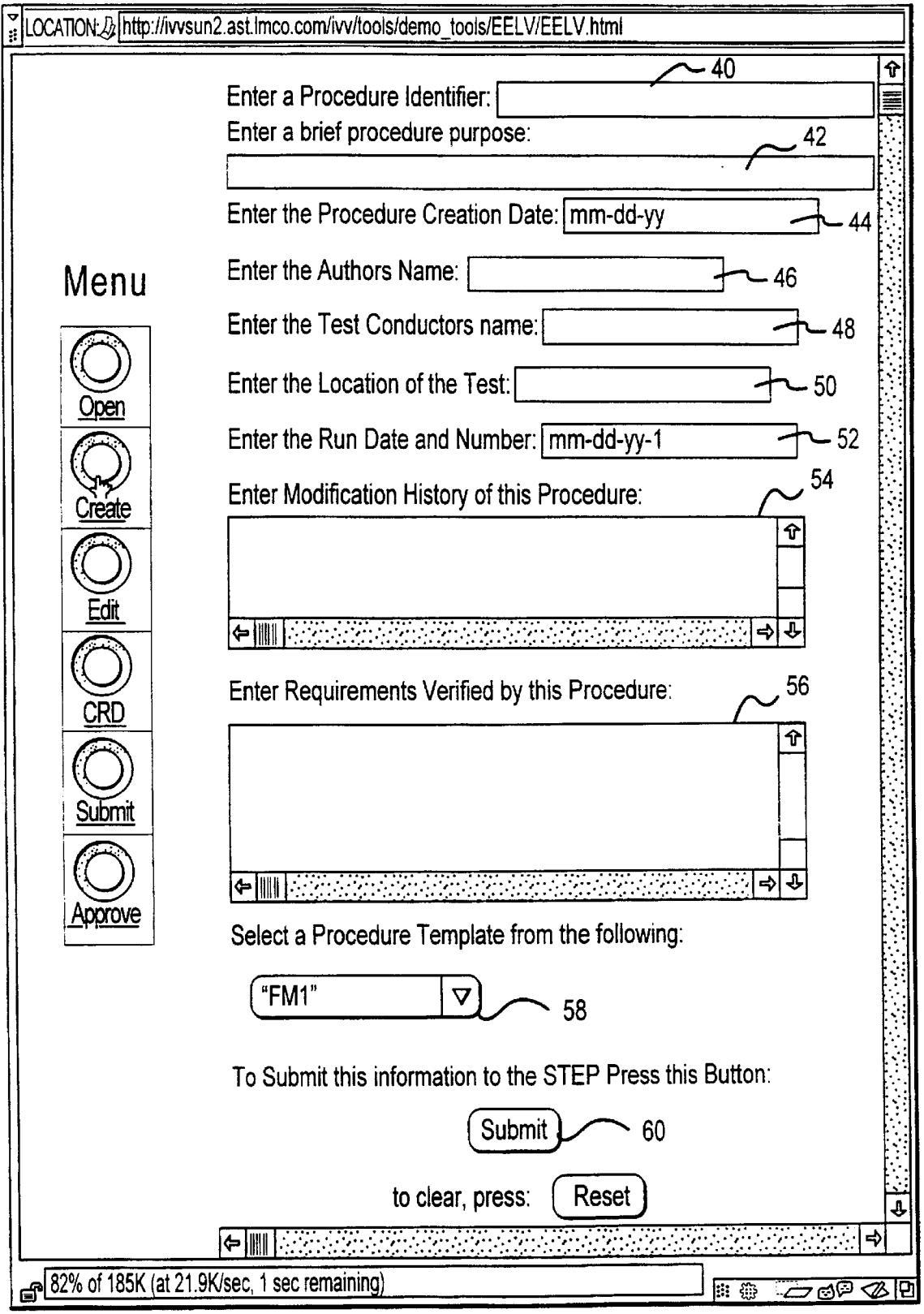
FIG. 7 discloses a screen display which provides a plurality of dialogue boxes for entering information about a new procedure to be created.

Disclosed in FIG. 7 is a screen display presented to the system user when a new STEP is to be created. Included in this display page are a number of dialogue boxes through which the system user may enter information relating to the test procedure to be developed. Dialogue boxes included in this screen display include a procedure identifier 40, a brief procedure purpose 42, a procedure creation date 44, an author's name 46, a test conductor's name 48, a location for test 50 and a run date for the test 52. Other dialogue boxes included in this display include a Box 54 for modification history for this procedure as well as a box 56 for requirements which would be verified by this procedure. This information may be entered through use of cursor and keyboard employed as part of the user interface.

In the situations where the system user wishes to employ a pre-existing template as part of the test procedure to be developed, the dialogue box 58, which includes a pulldown menu, provides for the use/incorporation of a number of pre-existing templates. The system user may select the template to be employed and then press the submit button 62 and enter all the information into the system. The flowchart shown in FIG. 8 describes the process performed by the system to process the data entered by the system user and display the next screen display to be employed in the procedure creation process. The steps performed include generation of a header which includes all information provided by the system user. Also created is a file which includes information to be gathered and entered in the future is to be submitted. Also disclosed on the screen display are further interactive (radio) buttons which the system user may employ to create the test procedure.

Figure 8:
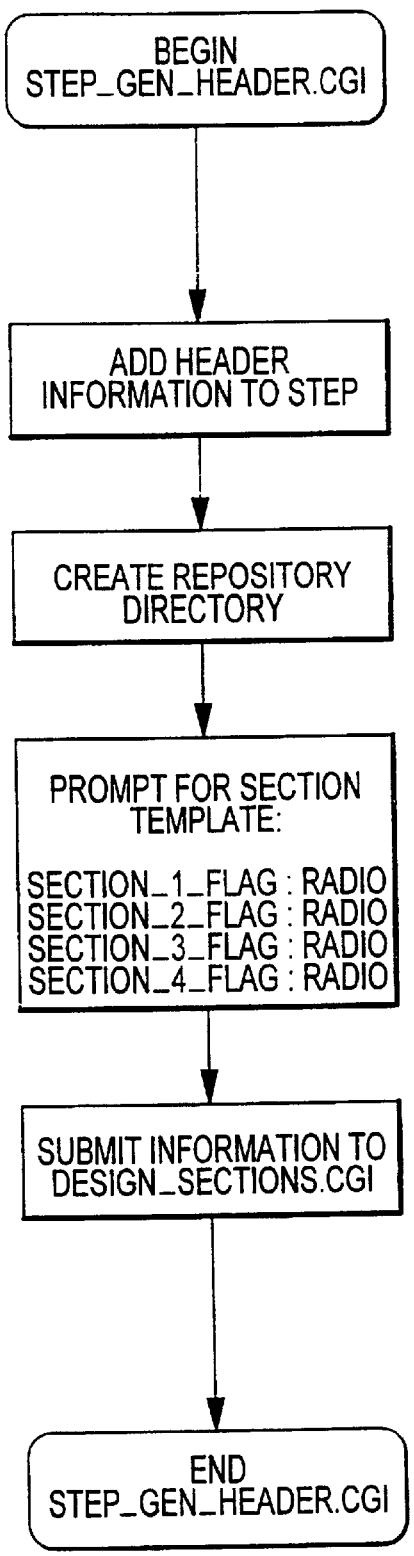
FIG. 8 discloses a flowchart which describes the receipt and entry of information relating to the new procedure to be created.
Figure 9:
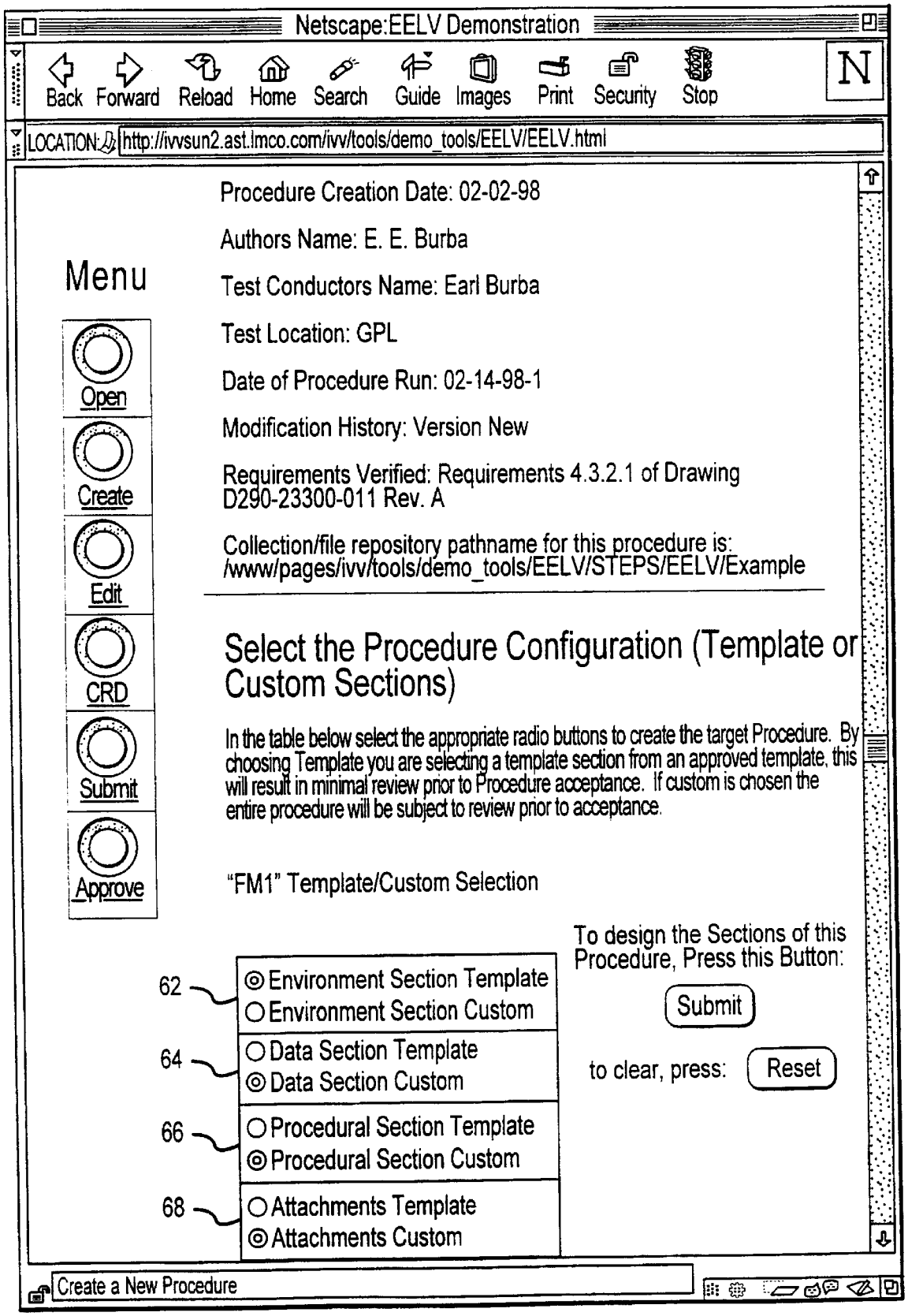
FIG. 9 discloses a screen display which may be employed to review information about a new procedure being created and to choose whether a custom procedure or pre-existing template will be employed in the creation process.
Figure 10:
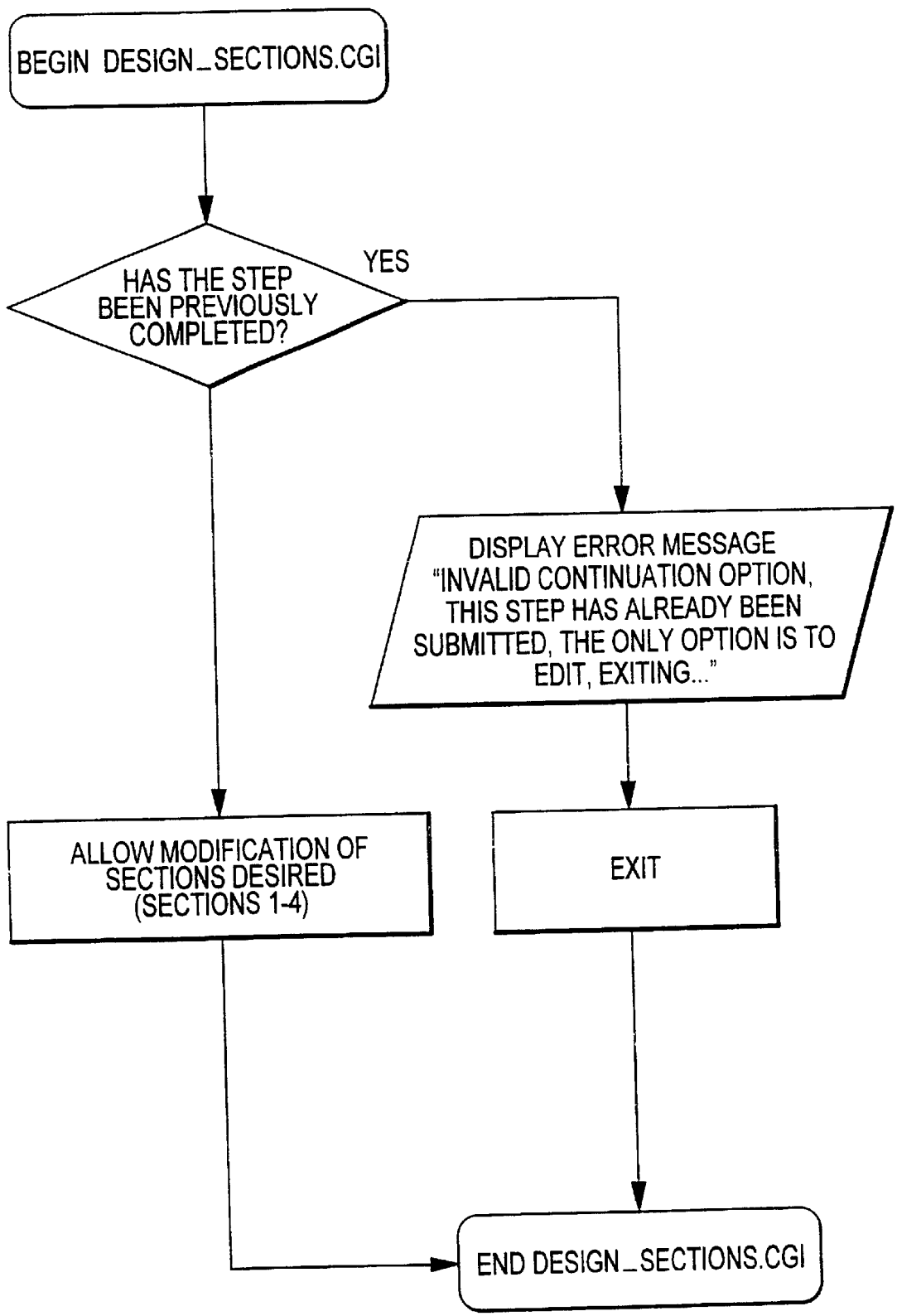
FIG. 10 discloses a flowchart which describes the initiation of the custom design process.

Disclosed in FIG. 9 is the screen display generated through the steps described in the flowchart in FIG. 8. As described, included in the screen display is a heading which includes the descriptive information entered by the system user. Also listed is a path name which may be employed in the future in order to locate and access this test procedure. Also shown on the screen display page of FIG. 10 are a number of radio buttons relating to the creation of a custom procedure, or the use of a already pre-existing template. As is seen in FIG. 10, four separate design sections are disclosed for creating a test procedure. They include the environment section 62, the data section 64, the procedural section 66 and the attachments 68. Through use of the radio buttons included, the system user has a choice of either creating a custom procedure in a particular section or employing an pre-existing template. Once these choices have been made, the submit button may be selected in order to enter this information in the system. Alternatively, the system user may clear this page through use of the reset button.

In the situation where the system user is to employ an pre-existing template, the information to be used with regards to this is found in the template which was previously selected in the display page disclosed on FIG. 7. In this example, the "FM1" template was chosen and in the situation where the system user has selected to use a template in the individual sections, this template will be accessed to provide the desired information.

Disclosed in FIG. 10 is a flowchart which describes the operations performed when the submit button in the screen display is selected. The first analysis performed is to whether this STEP has been previously completed. A scan is performed of the database to find this particular STEP. If it is detected that the STEP had been previously created, an error message is provided and the system exits from this particular part of the process. If this STEP has not been previously completed, the process continues by allowing modifications of the particular sections.

Figure 11:
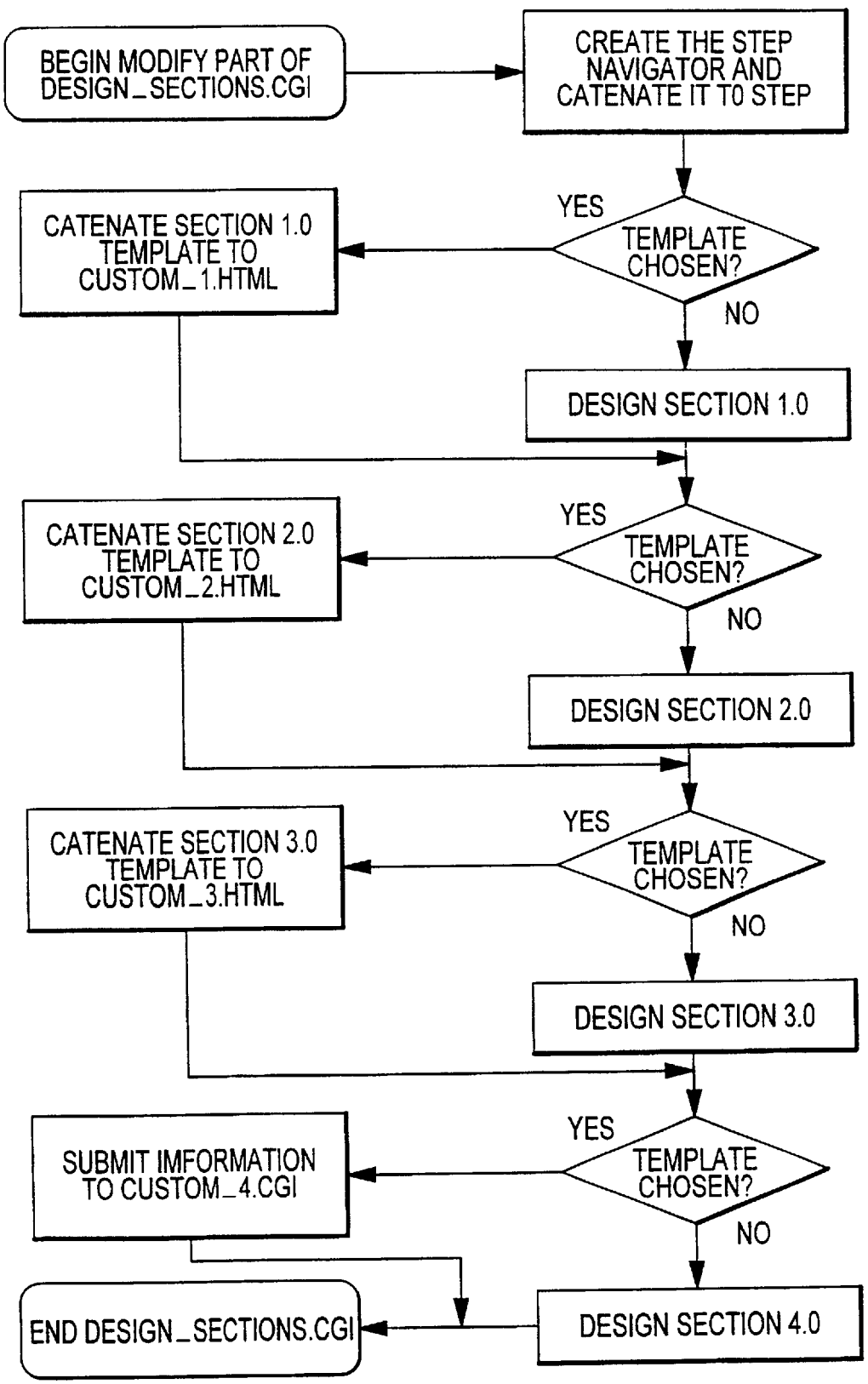
FIG. 11 discloses a flowchart which describes the steps taken with regards to choosing the type of template to be employed.
Figure 12:
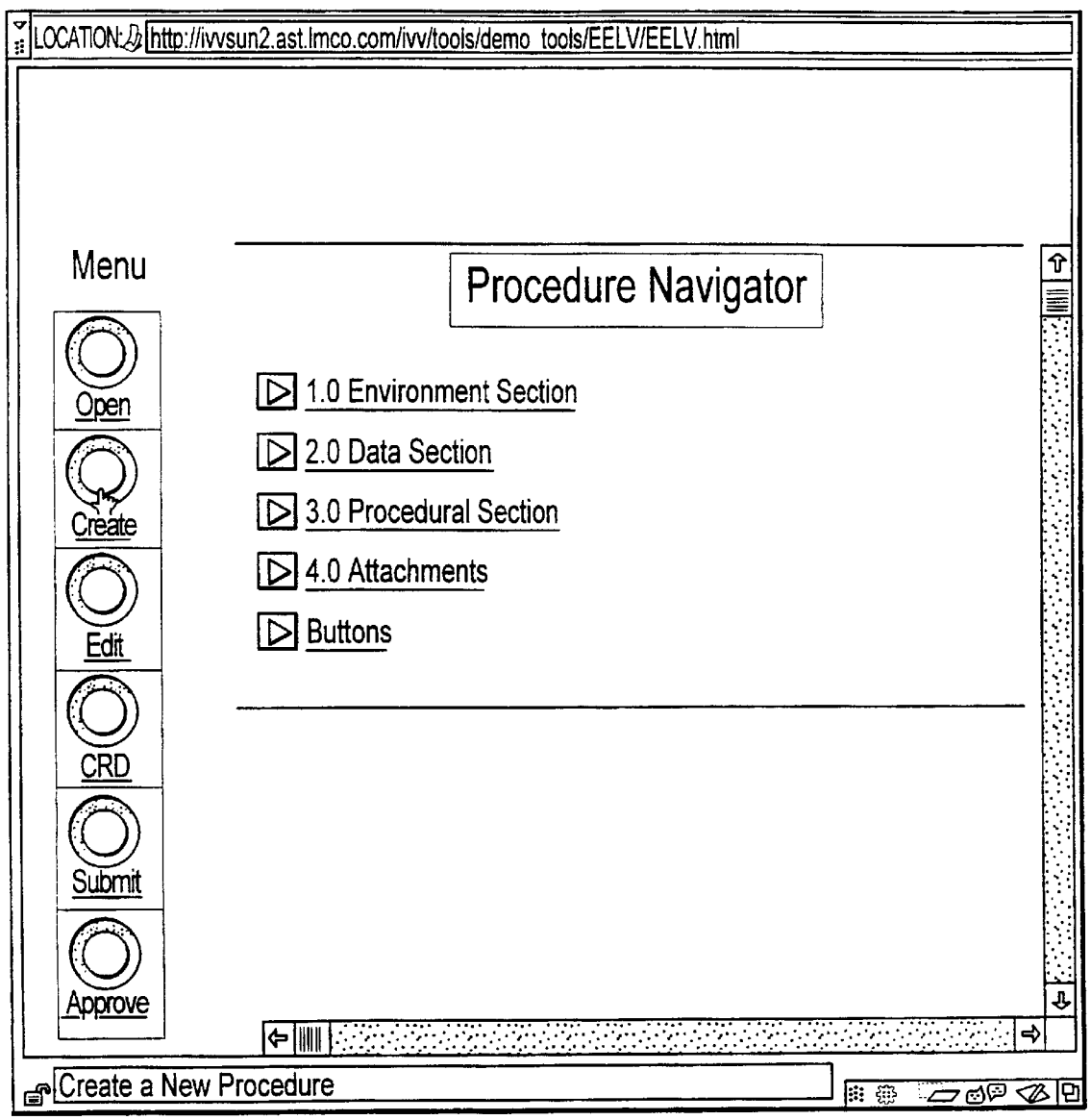

Disclosed in FIG. 11 is a flowchart which describes the processes performed when a choice is made to either use a pre-existing template or to custom design a procedure. As can be seen, if in Section 1.0, a template is chosen, the template chosen by the system user is located and the relevant information is catenated to the custom procedure being developed. This inquiry is made for all the design sections and if a pre-existing template is chosen it is retrieved and catenated to the document. If detected that the system user has chosen not to use a pre-existing template the design portion of each section is then accessed and the relevant screen displays presented. Because it is not necessary that the system user follow a particular order when creating the test procedure, the cursor device may be employed to select any of the relevant sections in any order.

Figure 13:
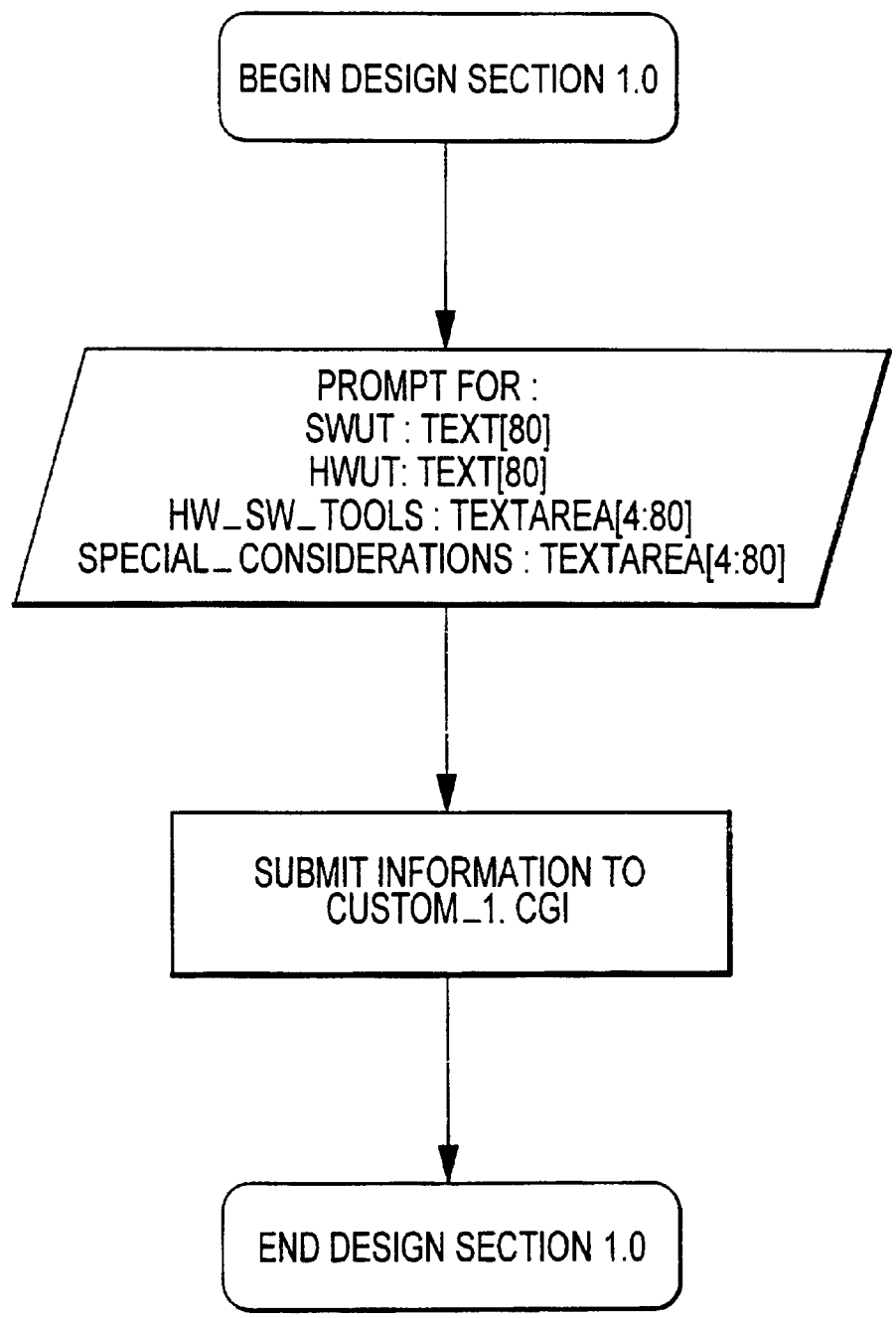
FIG. 13 discloses a flowchart which describes the steps performed when entering information in design section no. 1.
Figure 14:
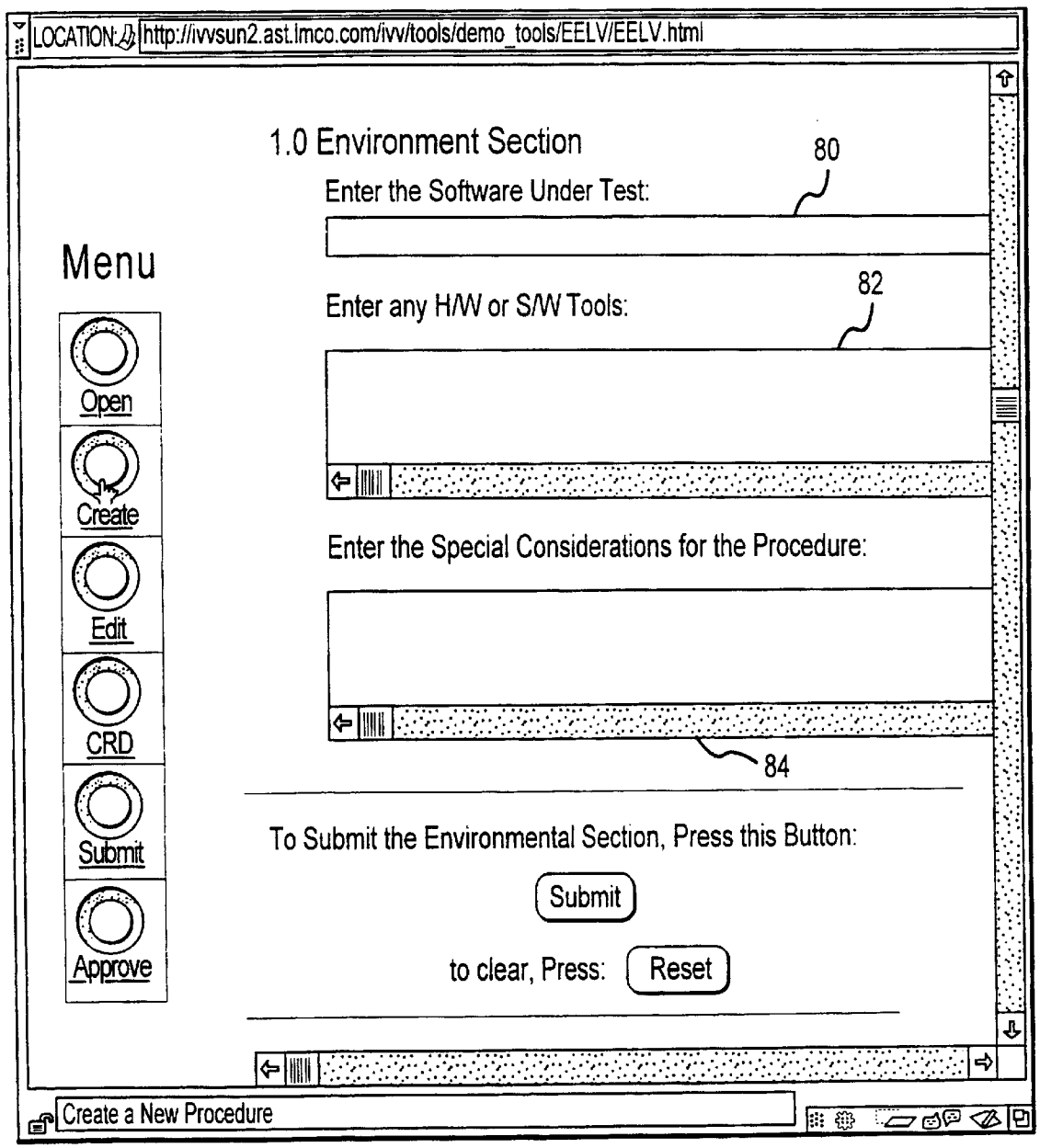
FIG. 14 discloses a screen display presented for entering information in section no. 1.
Figure 15:
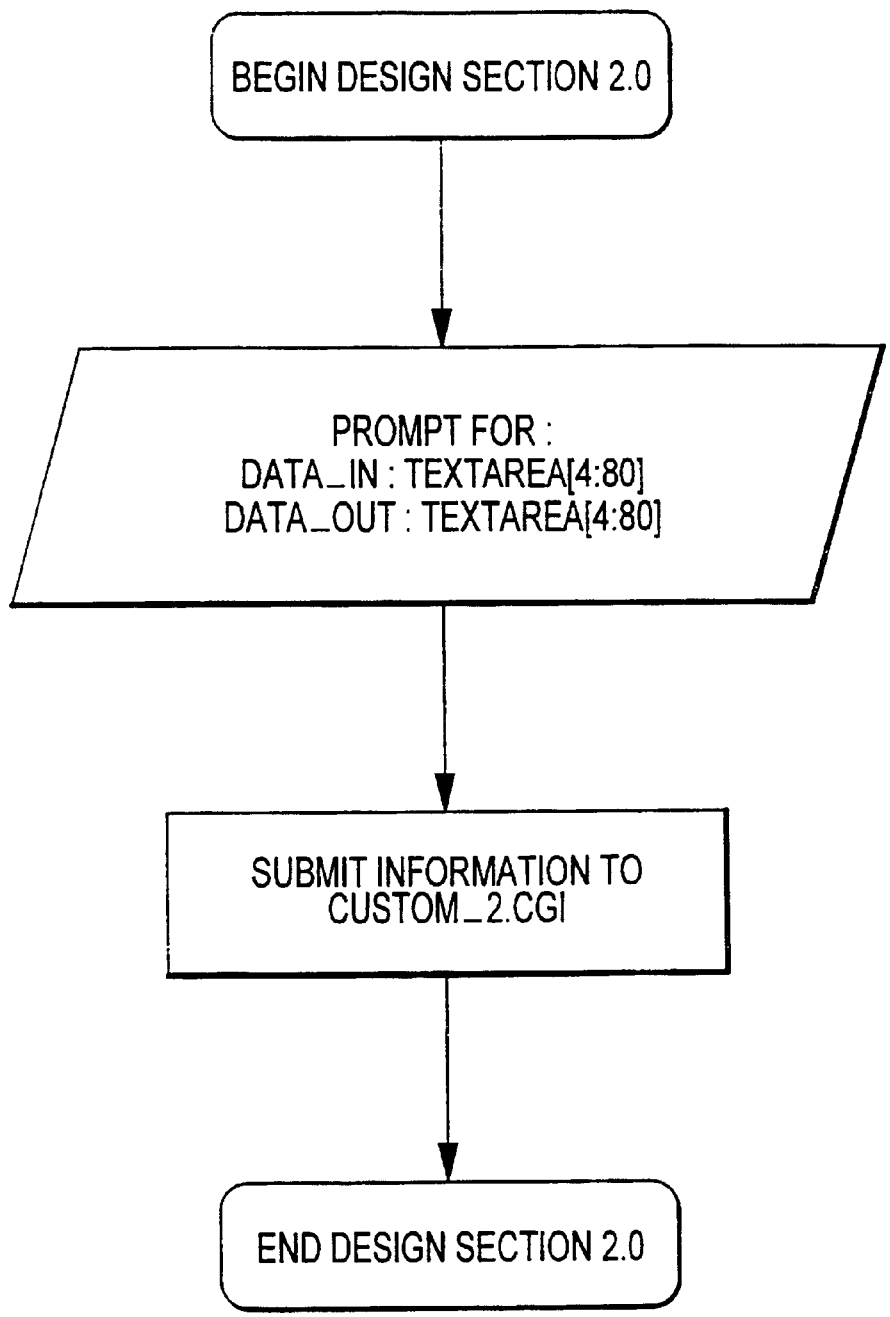
FIG. 15 discloses a flowchart which describes the steps performed when entering information in section no. 2.

If the system user chooses the environment section 1.0, the processes described in the flowchart of FIG. 13 are performed. In this case the design section 1.0 page is accessed and presented. Disclosed in the screen display of FIG. 14 are a number of dialog boxes which a system user may use to enter information about the test to be performed. In the dialog box 80 is provided to enter the software under test. An additional dialog box 82 is provided for entering any hardware or software tools employed during the test. Finally dialog box 84 provides for the entry of special considerations for the procedure to be performed. This additional information which may be used by those performing the tests. Examples of this type of information include: special hardware or software patches (customized test equipment), unusual wiring or test configurations, deviations from standard operating procedures, special test actions regarding safety or hazards, or other tester action not covered elsewhere in the STEP. Upon entry of the relevant information in the dialog boxes, the submit button may be depressed and the information entered into the system.

Upon completion of design section 1.0, design section 2.0 may be initiated and the steps described in the flowchart in FIG. 11 are performed. In particular, a display screen is provided for entry of information for this design section. Disclosed in FIG. 16 is the screen display employed during design section 2.0. This design section is used to enter data sets or other information which are to be employed during the execution of the custom test procedure. Dialog box 86 is provided for any entry of any information which may be needed to execute the tests. This may include data decks, data files, or any other stimuli. Further, dialog box 88 is provided to enter information which may assist the tester in identifying an expected result or output from the test procedure. Upon completion of entry of this information, the submit button may be depressed and the information is entered into the system.

Figure 17:
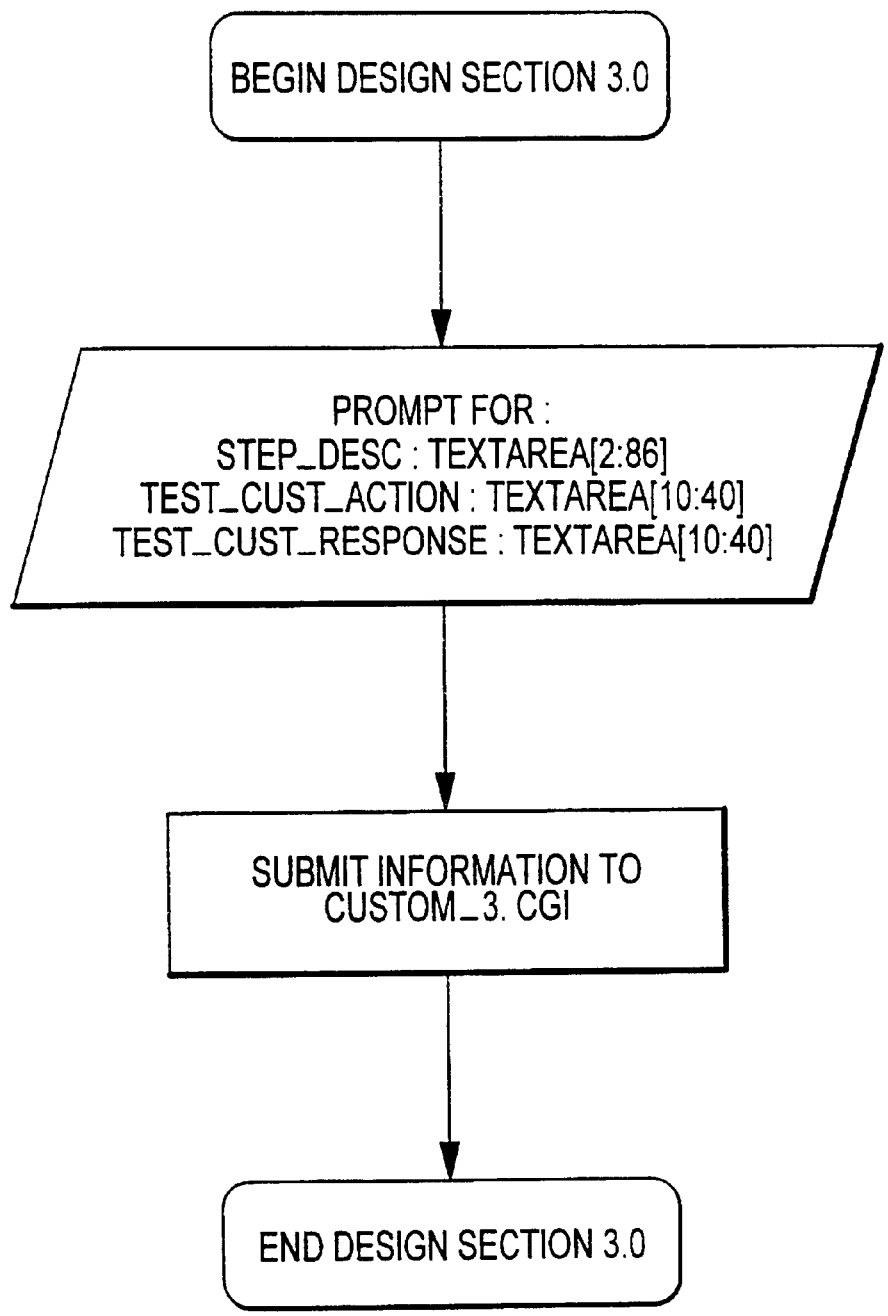
FIG. 17 discloses a flowchart which describes the steps performed in design section no. 3.
Figure 18:
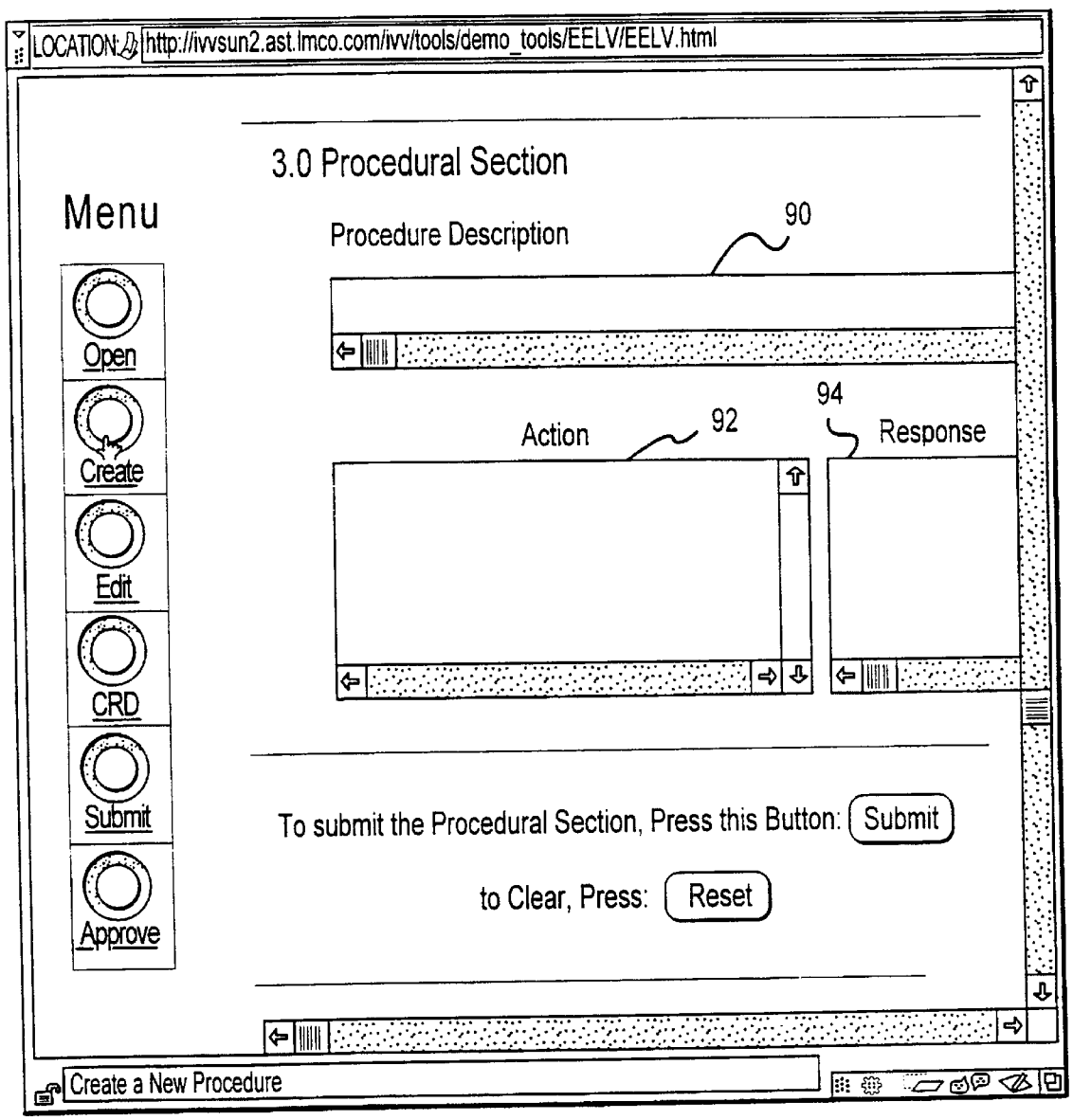
FIG. 18 discloses a screen display presented for entry of information in design section no. 3.

Upon completion of design section 2.0, design section 3.0 may be initiated by the system user or begun automatically. After performing the steps disclosed in the flowchart of FIG. 17, the display page disclosed in FIG. 18 is presented. Through the dialog boxes included the system user may enter the actual steps to be performed during the test procedure. In particular, a dialog box 90 is provided for entering a procedure description. Information entered here relates to the steps or actions to be performed during the process. Dialog box 92 is provided for entering the steps which are to be performed during the procedure. Finally the dialog box 94 provides for the entry of the expected response to be noted for a particular action. Because the document is created in HTML, the system user has the opportunity at this point to create hypertext links between information entered in the dialog box with any remotely located information. When the test procedure is implemented, a system user may be then able to select the hypertext link and access additional information regarding the particular action. Upon completion of the entry of the information, the system user may select the submit button and the information is entered into the system.

Figure 19:
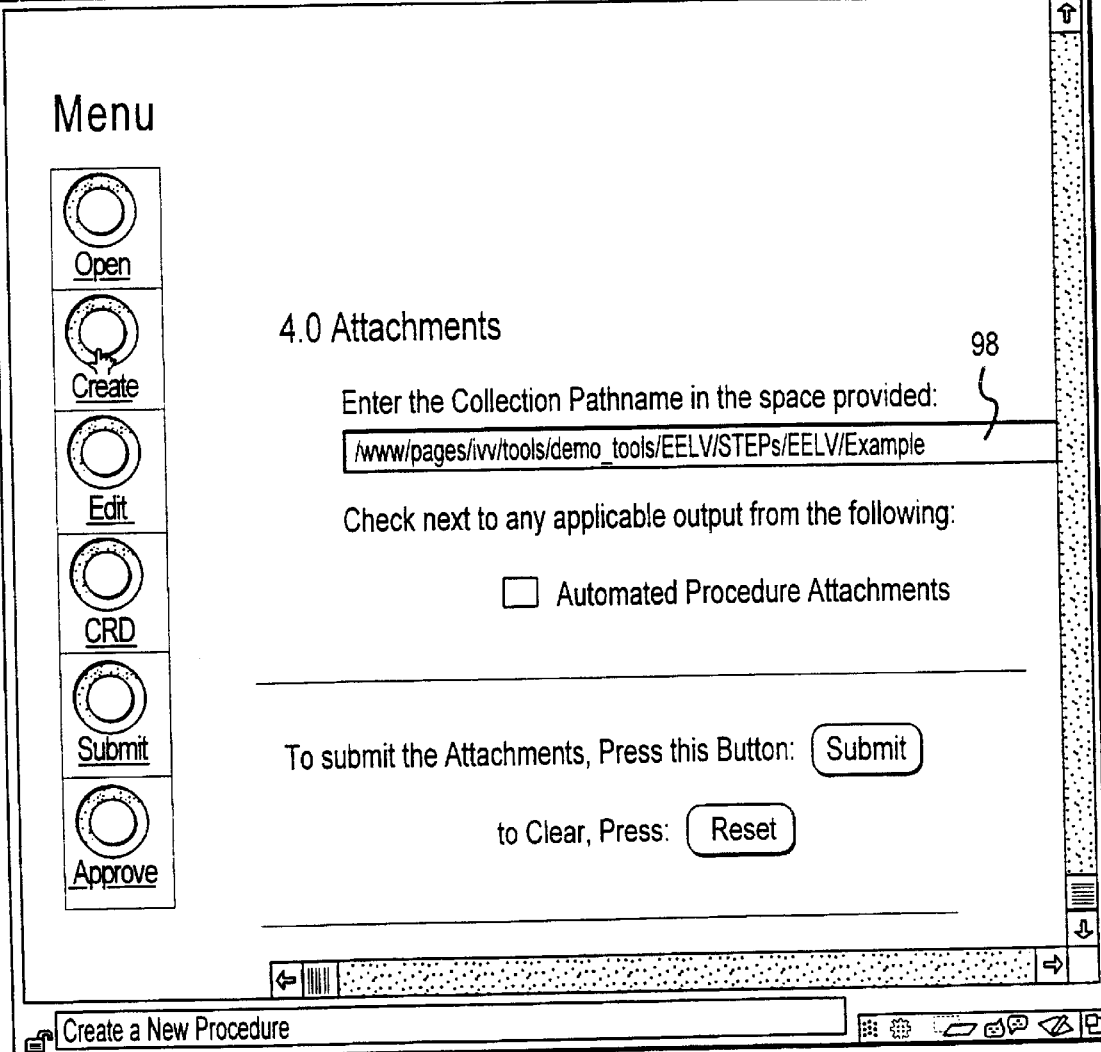
FIG. 19 discloses a screen display presented for entry of information with regards to section no. 4.

The final design section 4.0 is for creating attachments. This section is employed to attach to the procedure any relevant information which may be employed during the execution of the test procedure. As shown in the screen display of FIG. 19 a dialog box 96 is provided through which system user may enter a particular path for the relevant attachment. Upon completion the system user may submit this information.

Figure 20:
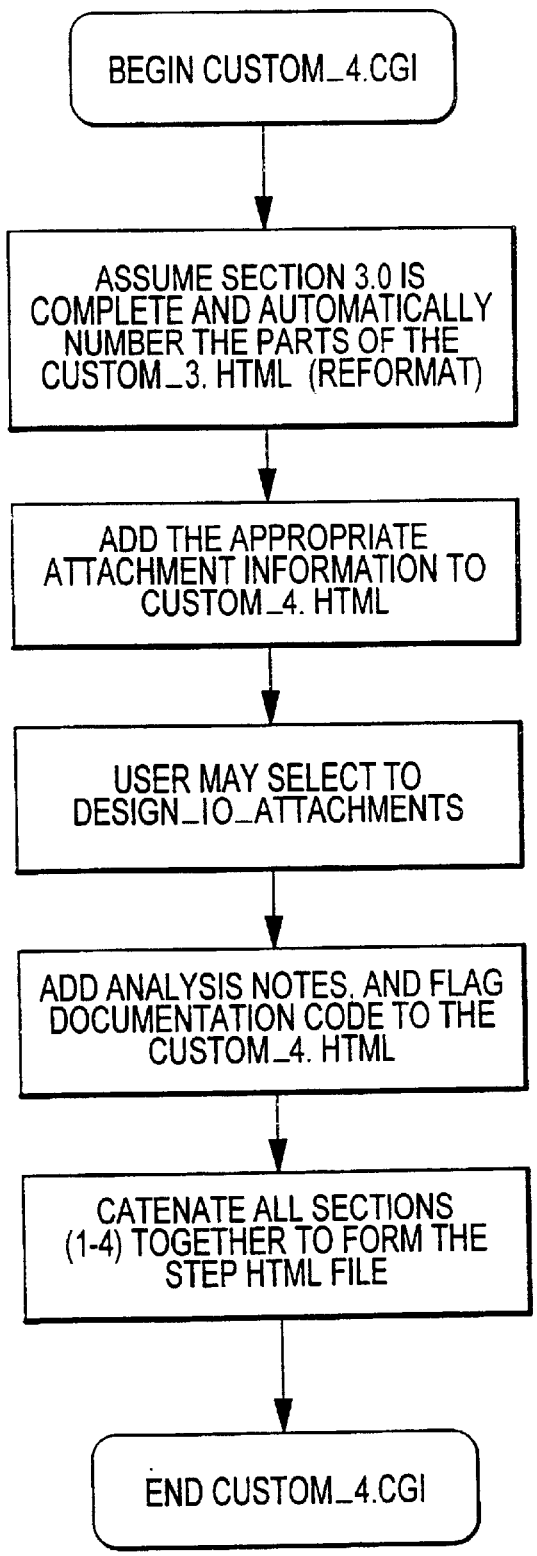
FIG. 20 discloses a flowchart which describes the steps performed during section no. 4.

Disclosed in the flowchart of FIG. 20 are the steps performed during and at the conclusion of the attachment section (design section 4.0). As can be seen, the appropriate steps are made to attach the information once it is entered in the dialog box. Upon completion, the system then will catenate all sections (1–4) together to form a single STEP HTML file. In the situation where the system user has selected to create all custom design sections, the catenation puts all of these newly created sections together into the single HTML file. Conversely, in the situation where one or more pre-existing templates were employed, the system will attach these templates with the newly created sections to form a new test procedure. This test procedure is then stored in the directory. In the situation where a custom test procedure has been developed, a submittal and approval process may be employed before the test procedure may be used by others. This submittal and approval process is described in greater detail below.

Figure 21:
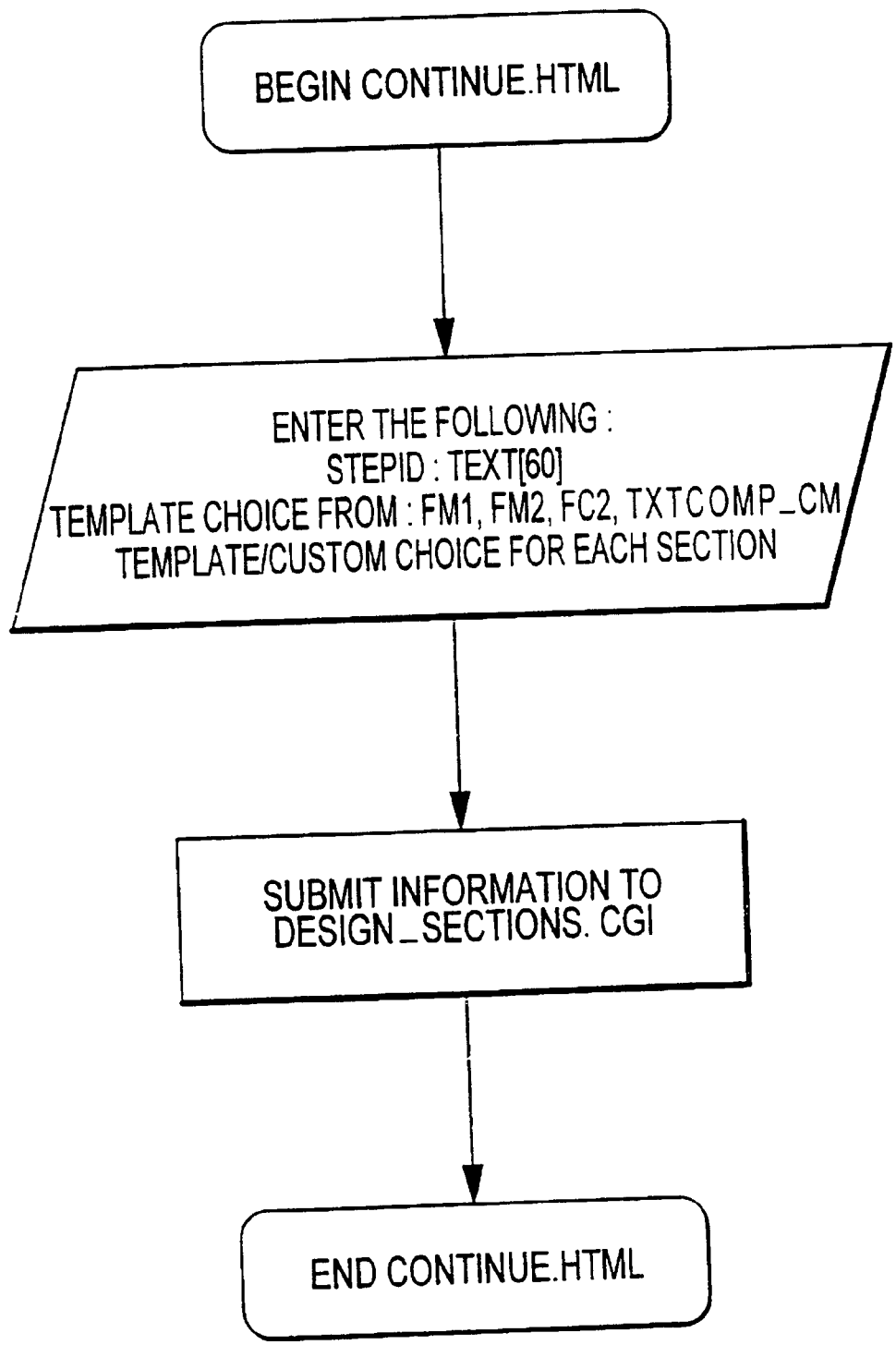
FIG. 21 discloses a flow chart which describes the steps performed when the routine design function is chosen.

Returning again to the screen display shown in FIG. 5 it is seen that the system user also had the option to continue designing a pre-existing STEP. If this selection is made, the system performs the steps disclosed in flowchart of FIG. 21. Initially a screen display is provided for the submission of information and once this information is entered it is further processed by the system.

Figure 22:
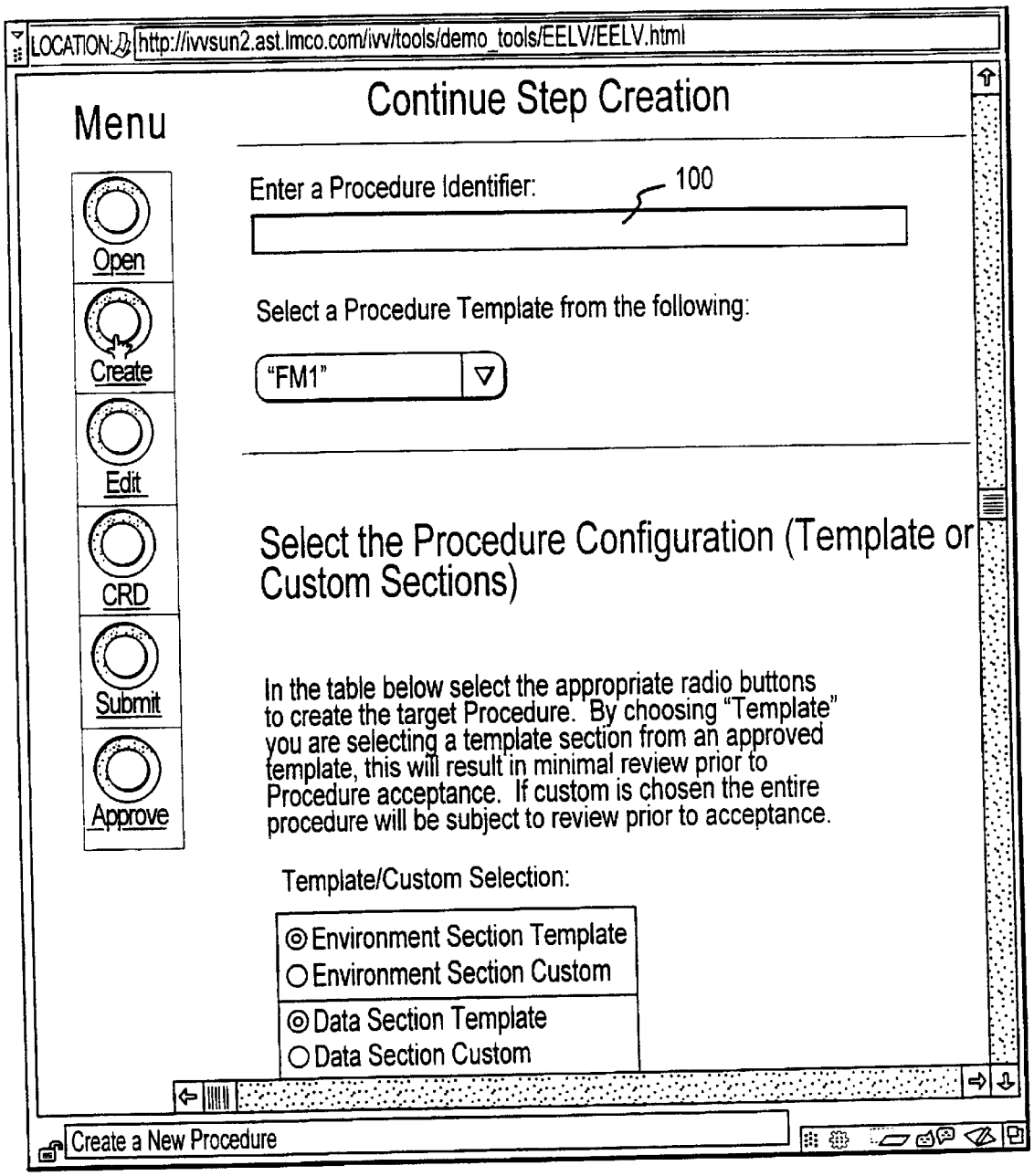
FIG. 22 discloses a screen display employed in the continue design process.

Disclosed in FIG. 22 is the screen display used in the continue process. Provided is a dialog box 100 in which a system user may enter the identifier for a procedure which the design process was begun but not completed. The system user may also enter a teacher template which may be used if custom procedures are not to be created. The system user also has the option of choosing a template or making custom procedures for the individual design sections. Once the design process is reinitiated, the same steps and procedures are employed as was discussed with regards to the initial create procedures process described in detail above.

Figure 2:
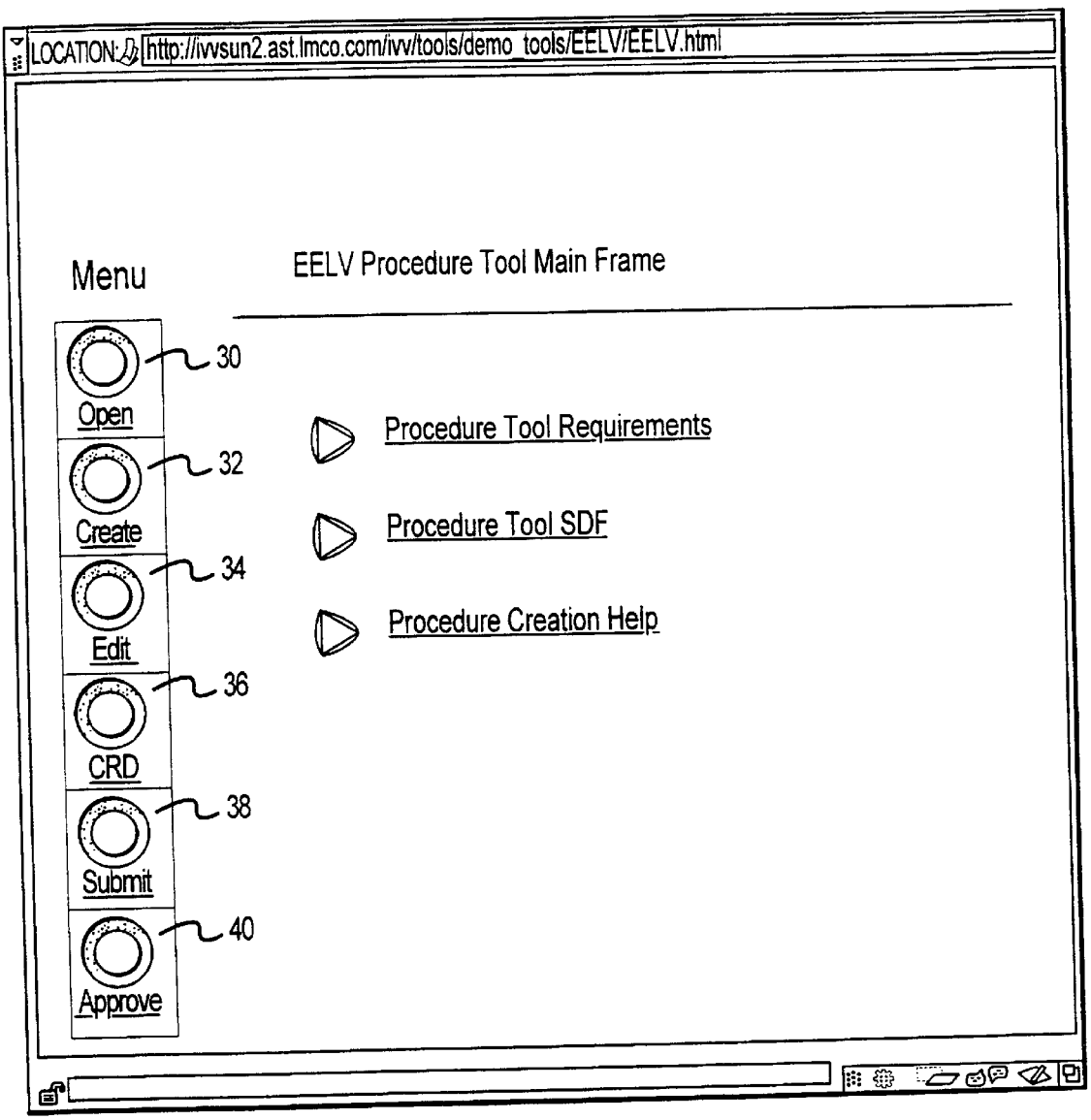
FIG. 2 discloses a main page interface viewable by the system user upon initial access to the system.
Figure 23:
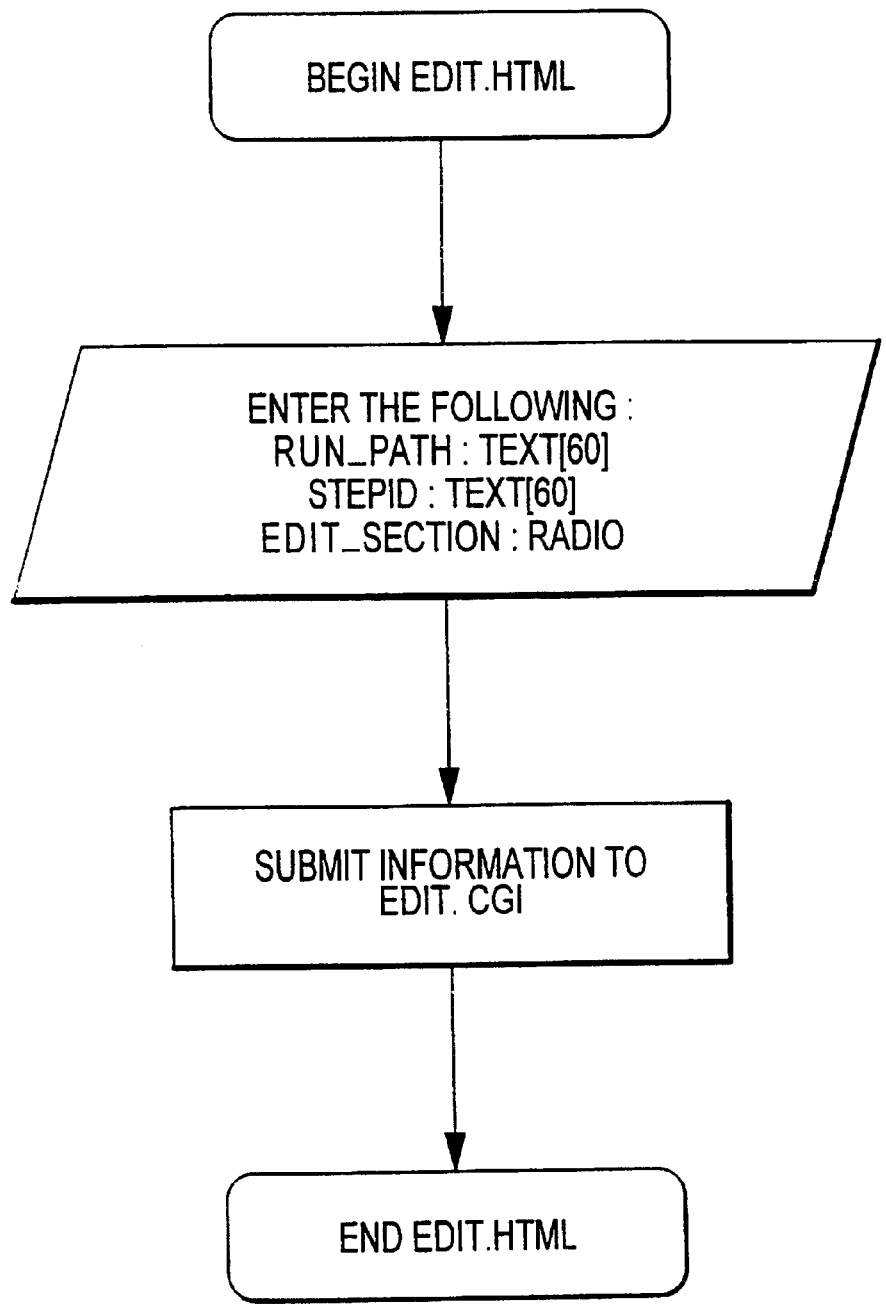
FIG. 23 discloses a flowchart which describes the operation performed when the edit function is selected.
Figure 24:
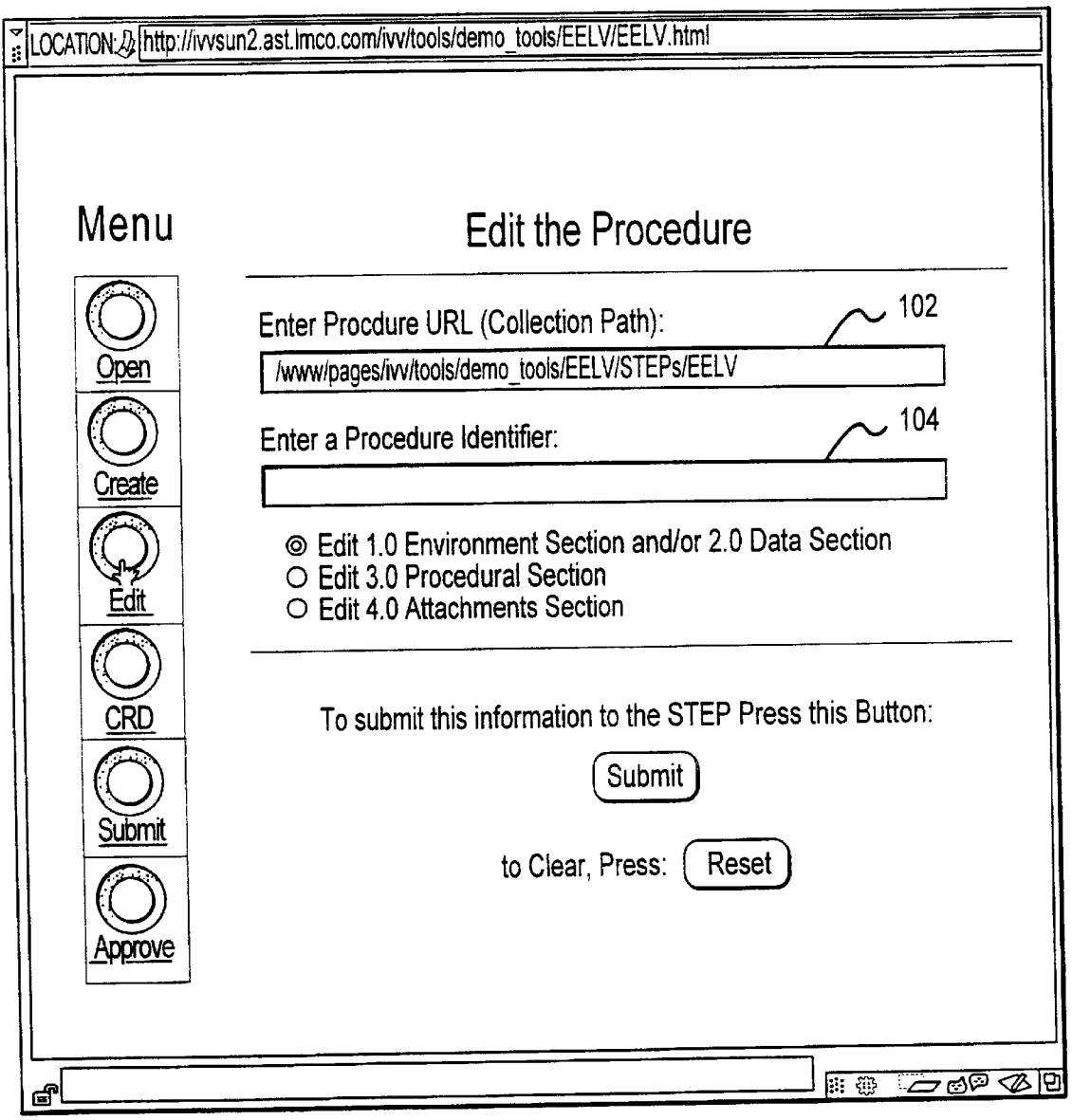
FIG. 24 discloses the display page presented when the edit function is chosen.
Figure 25:
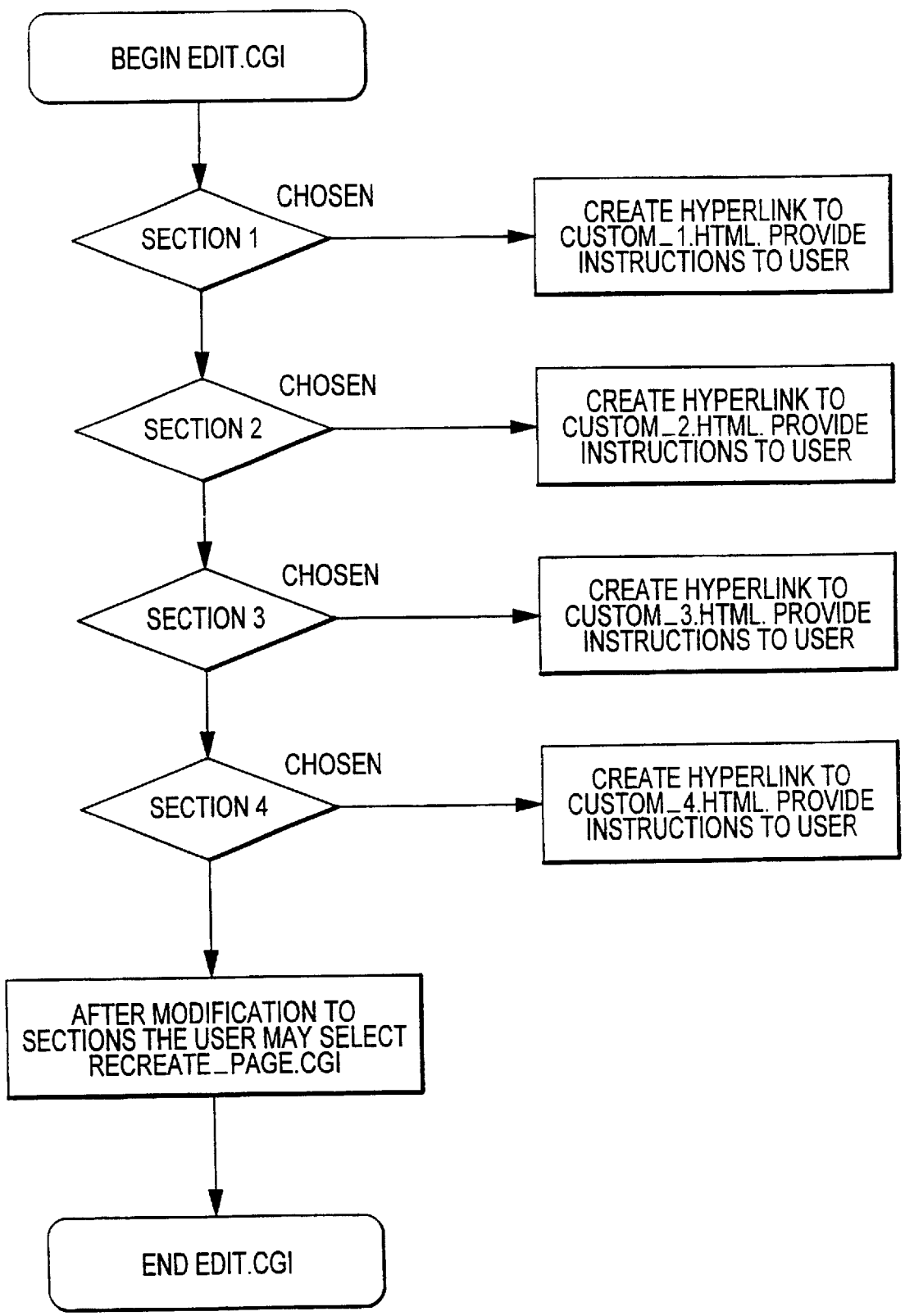
FIG. 25 discloses a flowchart which describes the operations performed on entry of information during the edit process.

Returning again to the button menu bar disclosed in FIG. 2 and throughout the screen displays disclosed herein. If the system user selects the edit button 34, the steps described in the flowchart of FIG. 23 are performed and the screen display disclosed in FIG. 24 is presented. Through use of the edit process, the system user can access a previously created test procedure and edit any of the sections. A dialog box 102 is provided for entering the URL for the procedure to be edited. An additional box 104 may also be provided for entering the procedure identifier. Radio buttons are also provided for editing a particular section of the selected procedure. Once all of the relevant information has been entered, the information is submitted and the steps disclosed in the flowchart of FIG. 25 are then performed.

Figure 26:
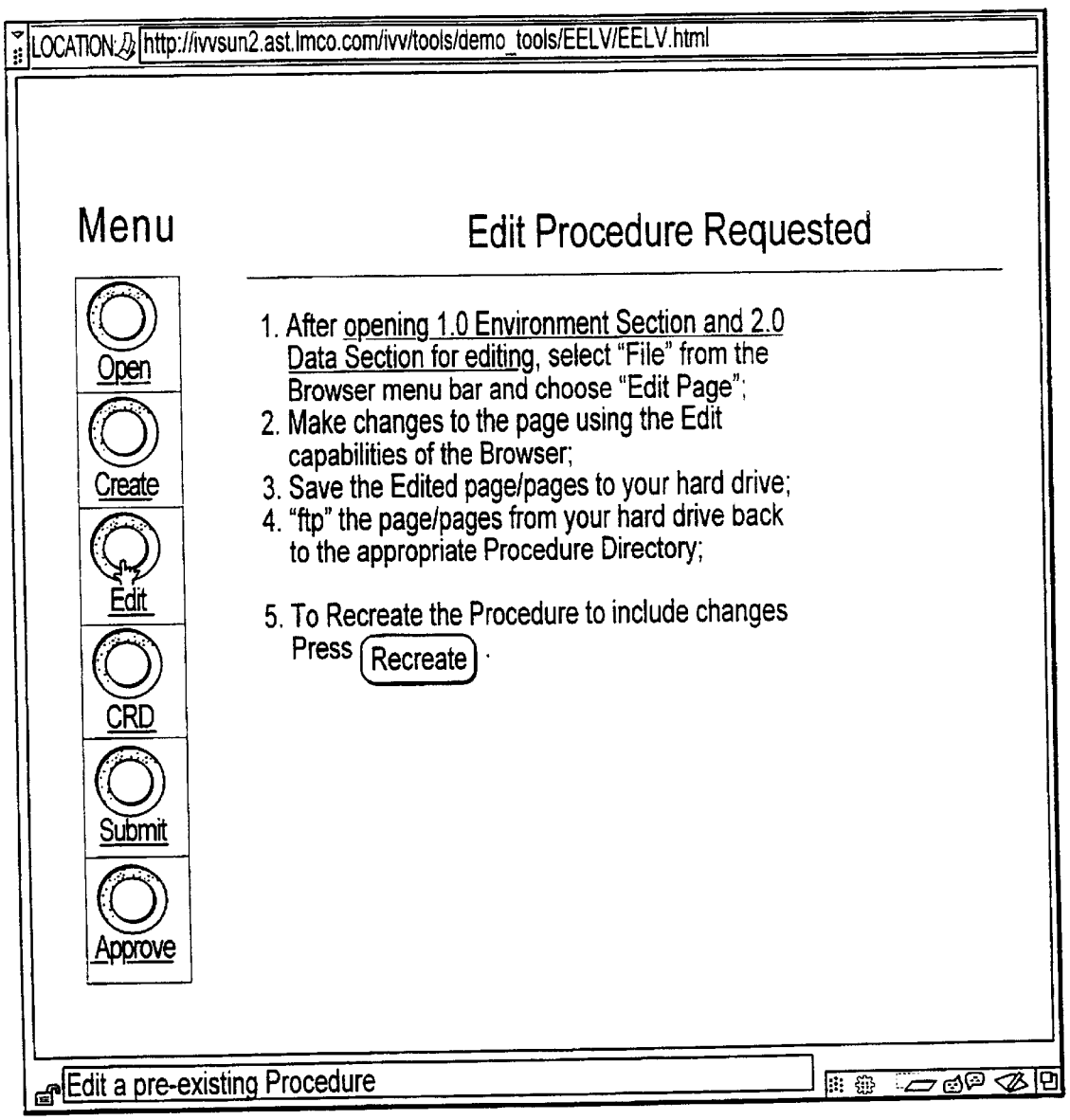
FIG. 26 discloses a page presented to facilitate the performance of editing processes.

Once the desired procedure has been accessed, the system user may then edit any of the individual design sections. Hyperlinks are provided in the screen display of FIG. 26 which allows the user to access this information and once displayed on the screen, edit it at their discretion. Hyperlinks to all the sections may be provided and editing performed on screen. After the editing process is complete, these modifications are entered into the document and stored in memory.

Figure 27:
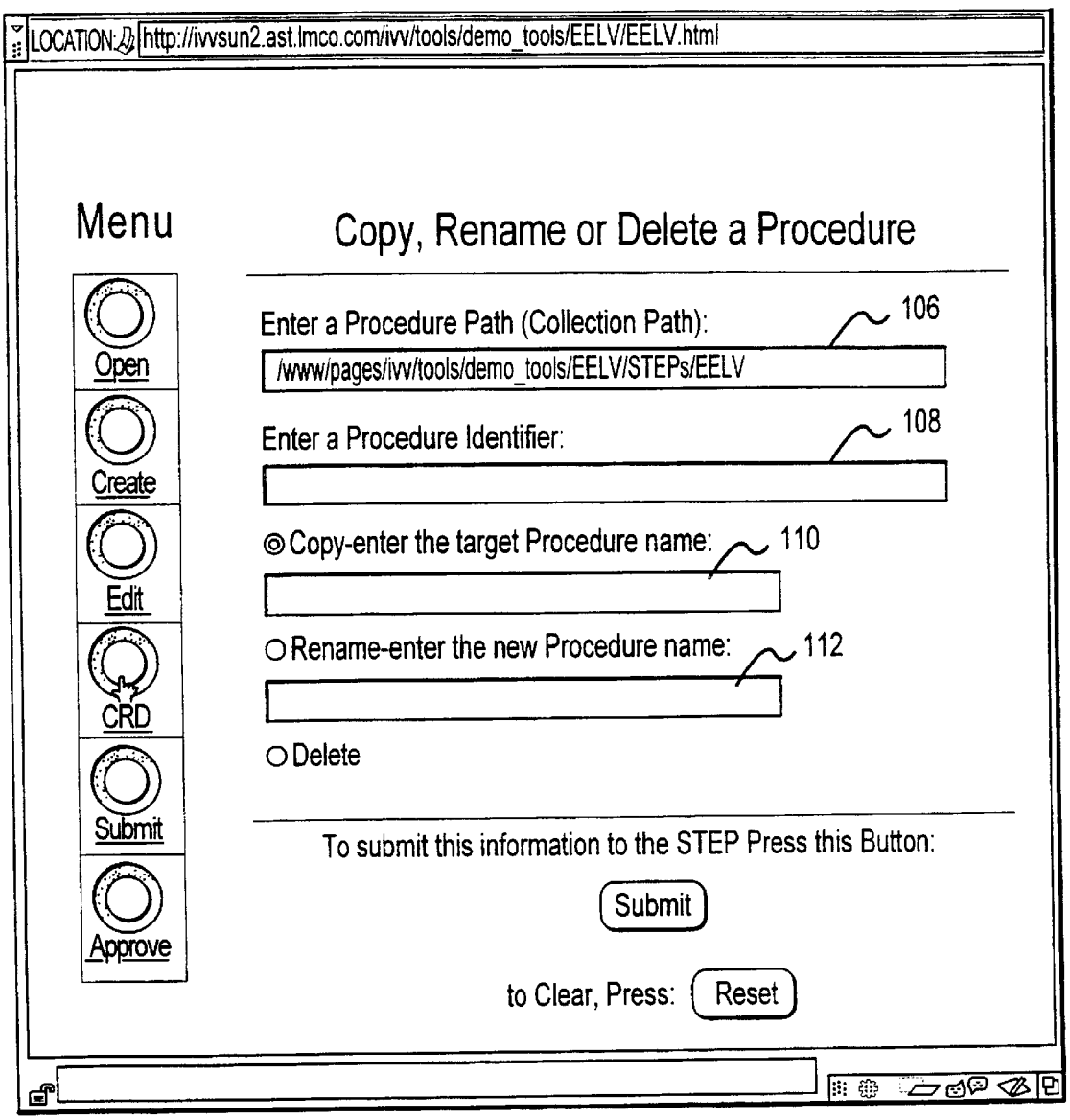
FIG. 27 discloses a screen display presented when employing the copy, rename, or delete procedure.

Returning again to FIG. 2, if the CRD button 36 is selected the screen display disclosed in FIG. 27 is provided. These functions are used when a system user wishes to either copy, rename or delete a procedure already in existence. Dialog box 106 is provided for entering a path to the procedure, and a box 108 is provided for entering an identifier. With regards to the other dialog boxes provided in the screen display, radio buttons are provided to choose either the copy, rename, or delete function.

In the situations where system user wishes to copy the target procedure, a new name may be entered into dialog box 110. In situations where the system user wishes to rename the new procedure a new name may be entered in the dialog box 112. The system user merely needs to select the delete function to delete the identified procedure. Upon selection and entry of the desired information the function will be performed.

Figure 28:
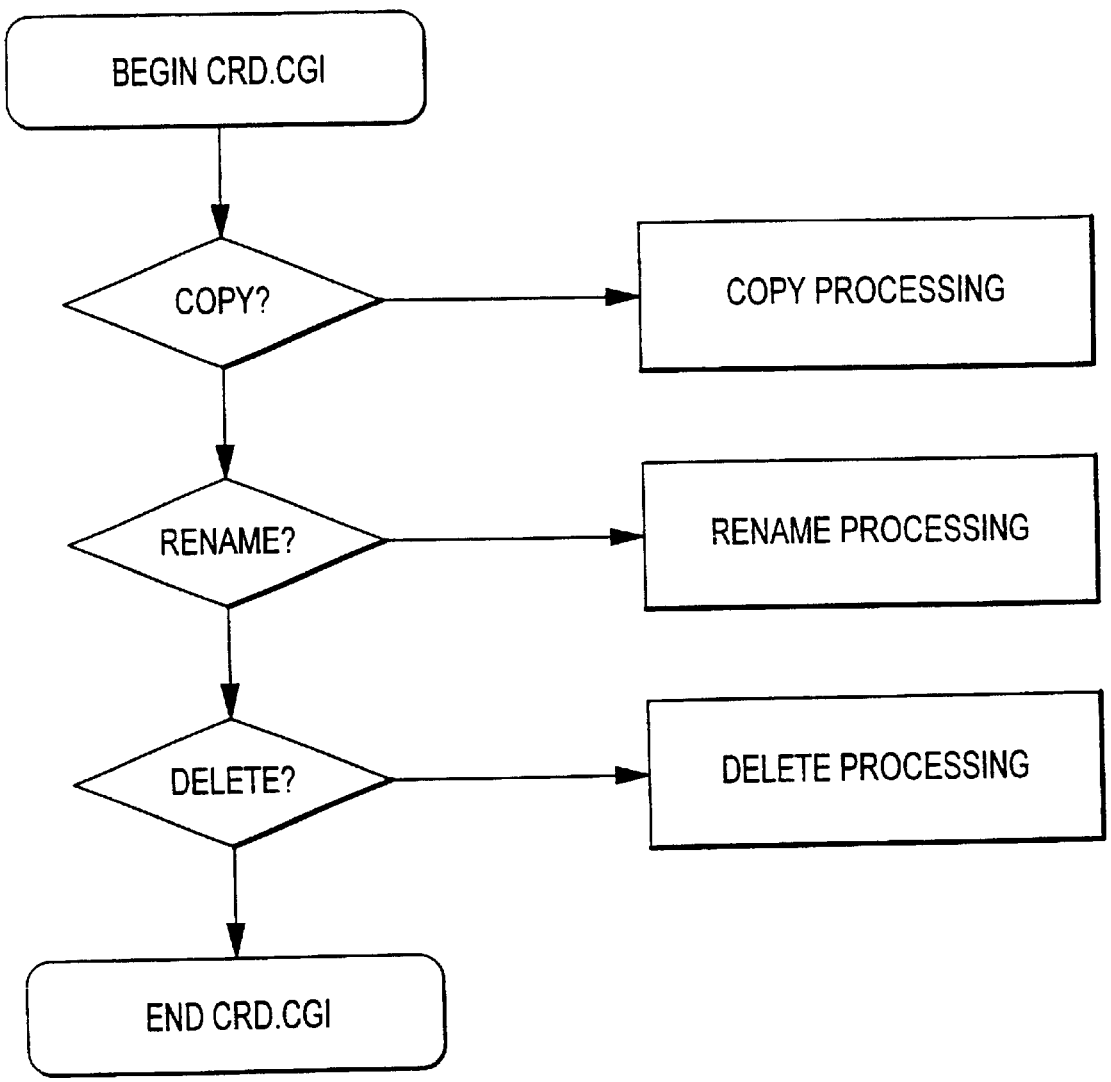
FIG. 28 discloses a flowchart which describes the copy/rename/delete processing.
Figure 29:
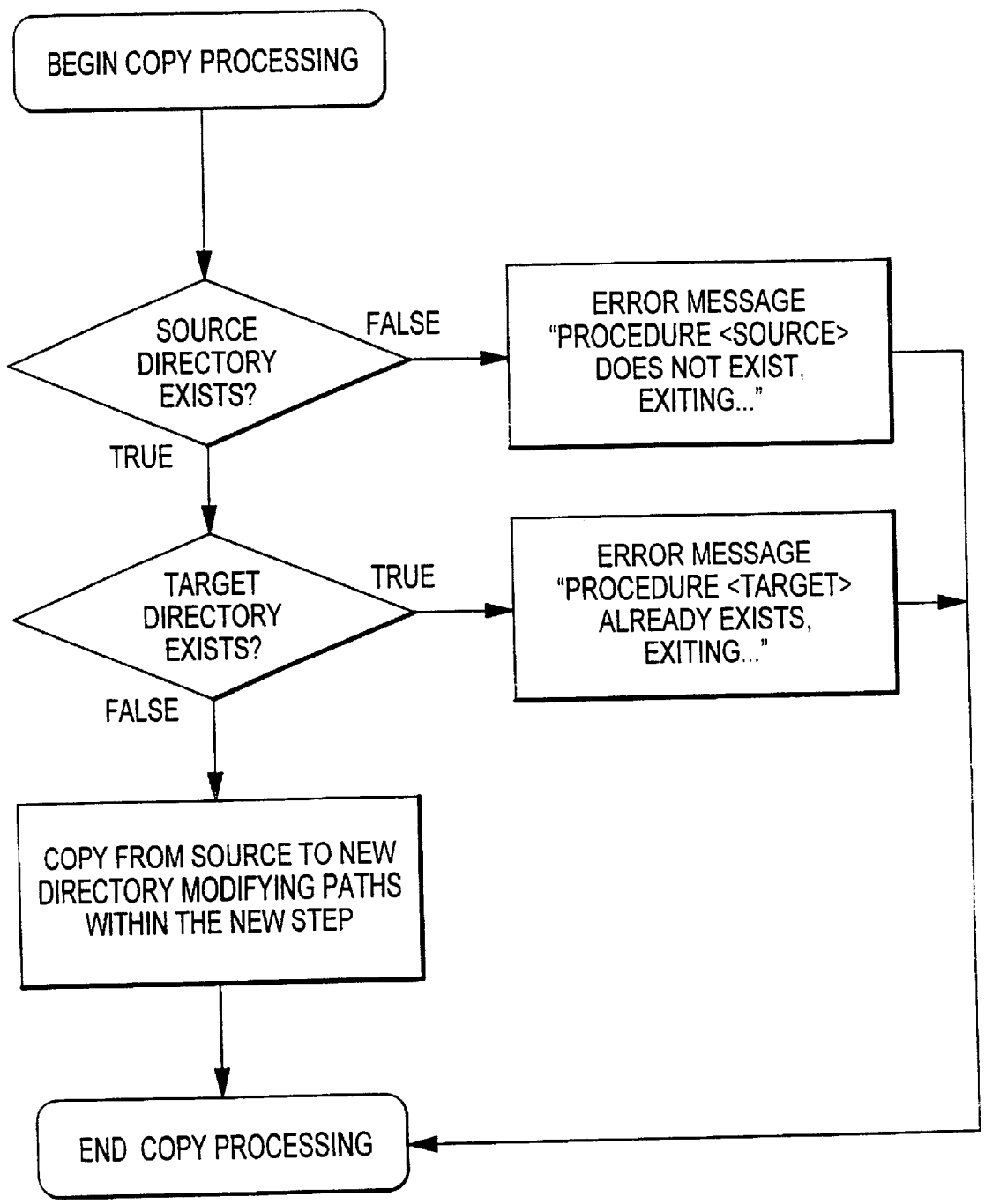
FIG. 29 discloses a flowchart which describes the steps performed in the copy process.

FIG. 28 discloses a flowchart which describes the operation of the system for activating either the copy, rename, or delete functions. In the situation where the copy function is initiated, the steps disclosed in the flowchart of FIG. 29 are performed. A first query relates to whether a source directory exists. If no source directory is found, an error message is displayed indicating this fact. If source directory does exist and it is shown that the file has already been copied, an error message is provided indicating that the procedure already exists. If the target directory does not exist the procedure is then copied to the desired directory and paths within the STEP are modified.

Figure 30:
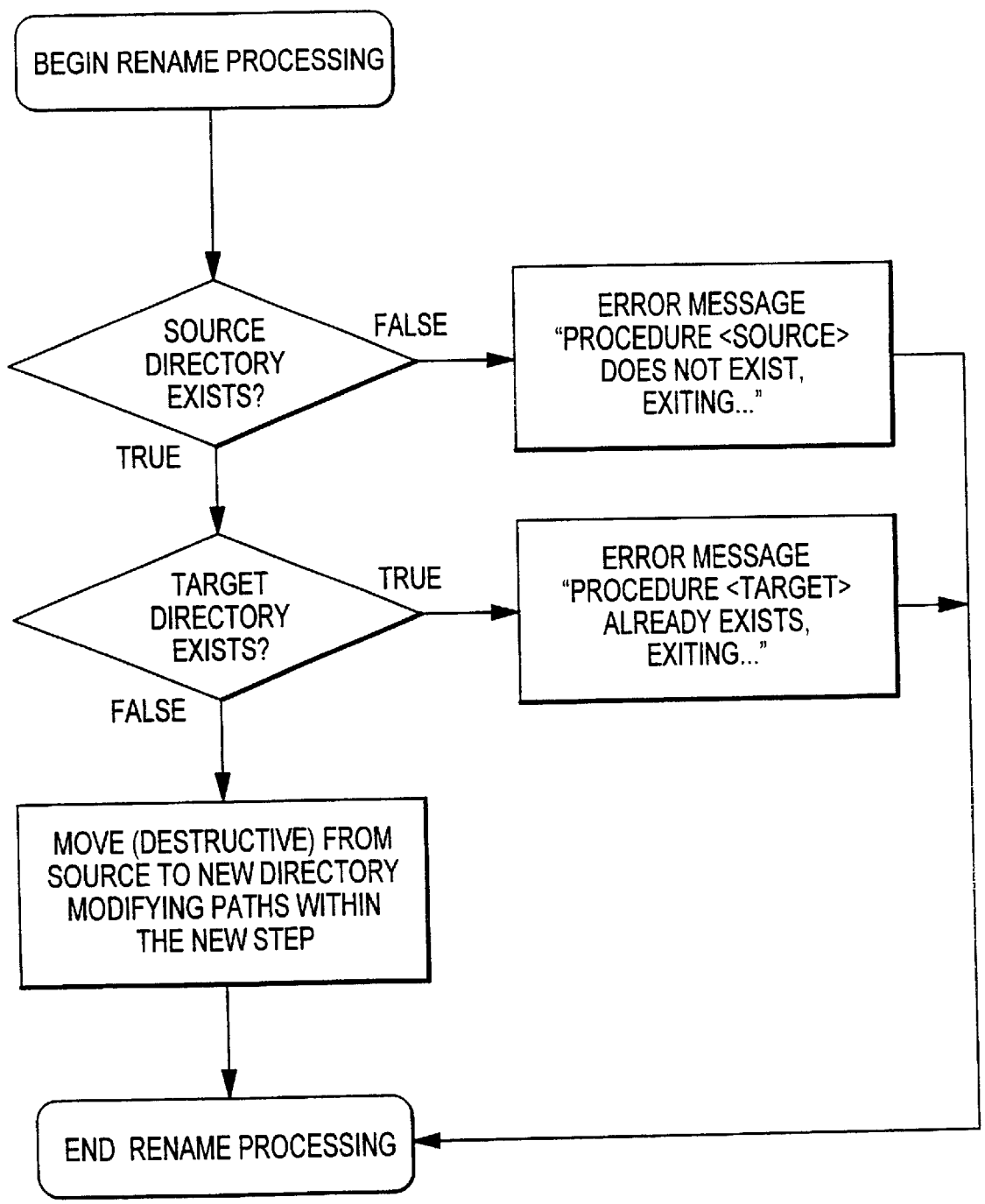
FIG. 30 discloses a flowchart which describes the steps performed during the rename process.

The flowchart disclosed in FIG. 30 describes the steps performed to rename a procedure. If a source directory does not exist, an error message is provided indicating this. If the source directory exists and a directory already exists with this name an error message is provided. If the target directory does not exist, the rename function is performed and the process is completed.

Figure 31:
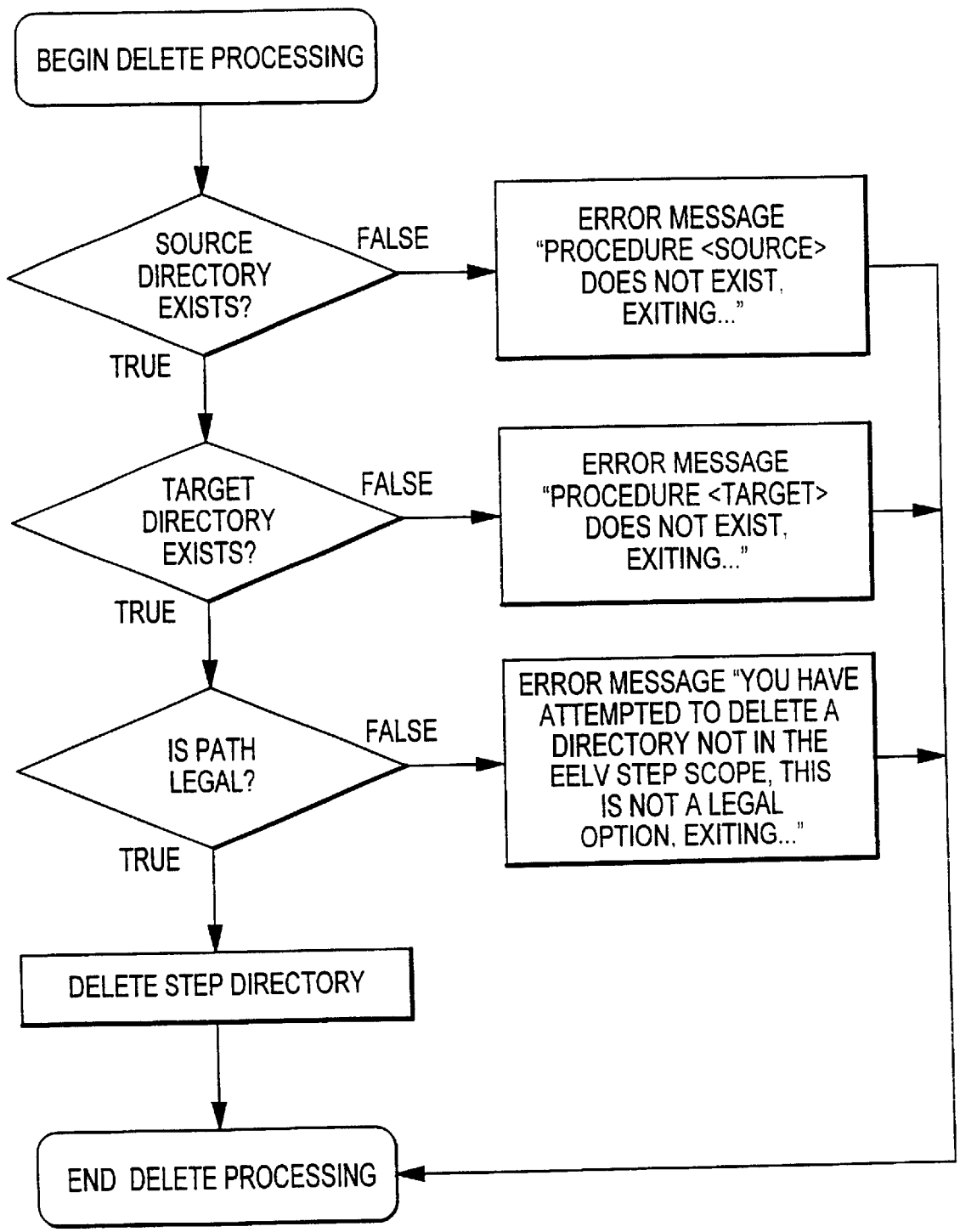
FIG. 31 discloses a flowchart which describes the steps performed in the delete process screen display presented upon selection of the submit function.

The flowchart disclosed in FIG. 31 describes the process performed during the delete function. As with the copy and rename functions, queries are made as to whether a source directory or a target directory exists. Error messages are provided in the same circumstances as provided above. If it is determined that target directory does exist, a directory check is made as to whether the path is legal. If the path is not legal, an error message is provided indicating that deleting the particular STEP is not a legal option. If the path is legal, the STEP directory is deleted.

Figure 32:
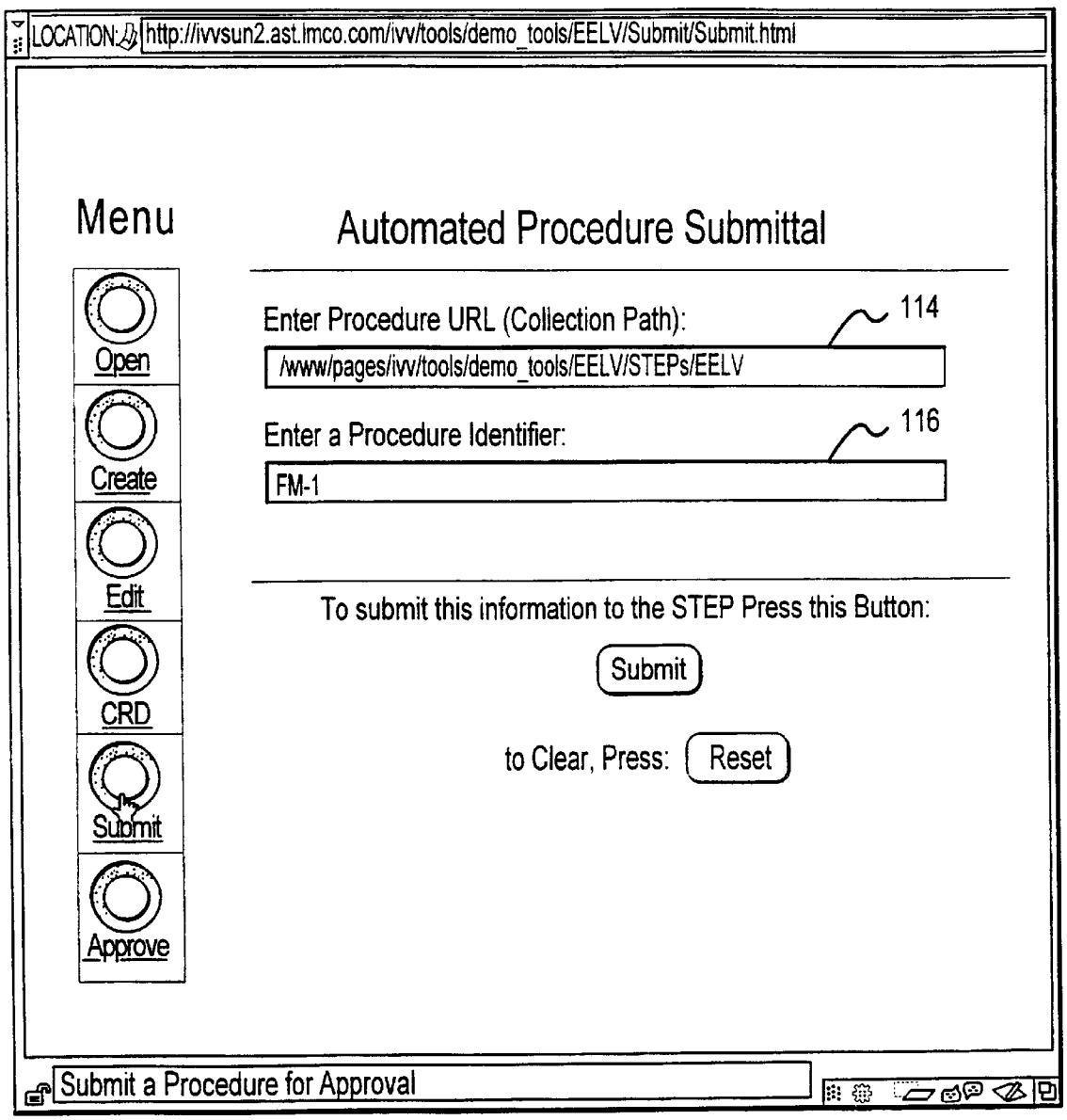
FIG. 32 discloses a display page presented when a request is to be submitted.
Figure 33:
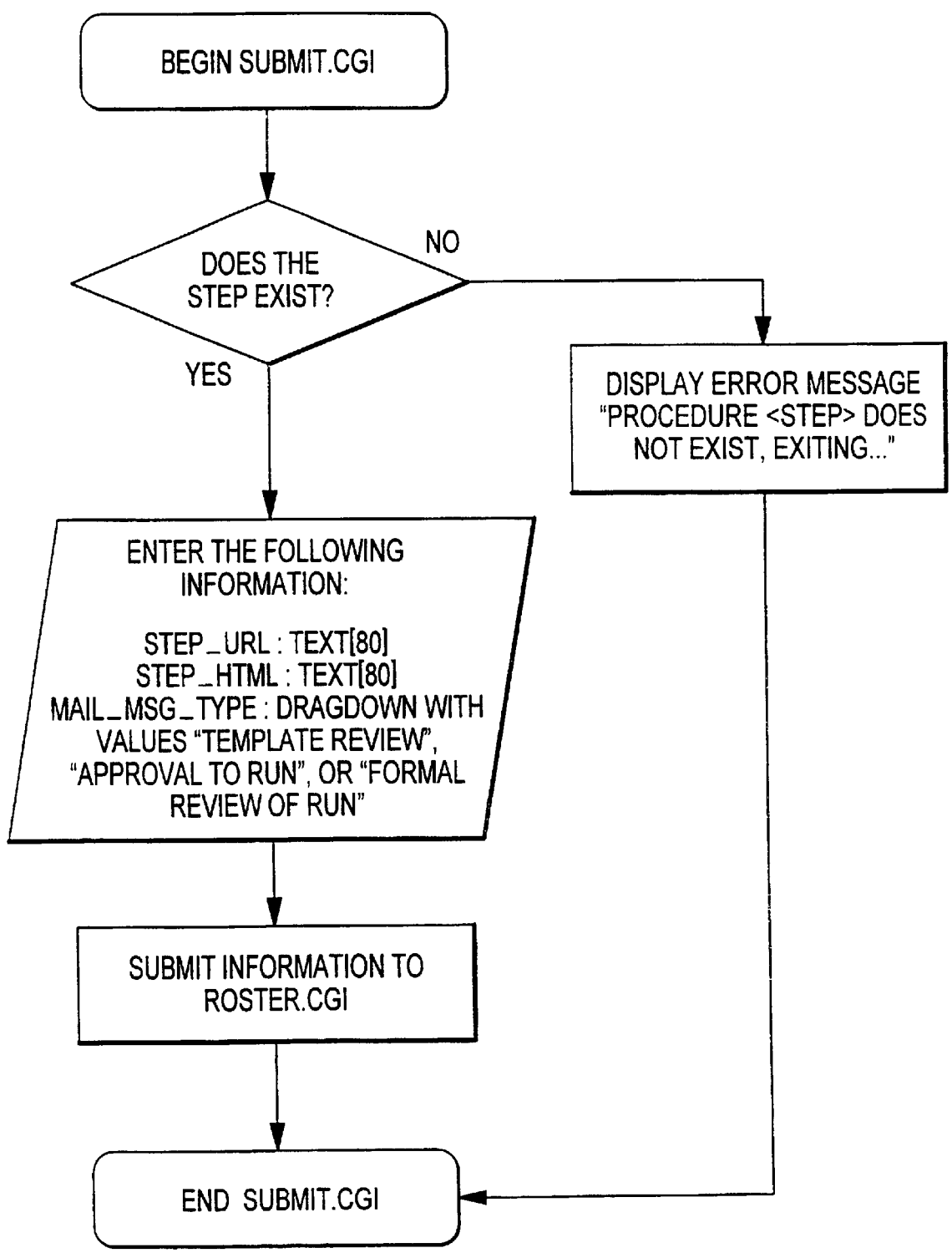
FIG. 33 discloses a flowchart which describes the operations performed during the submit process.
Figure 34:
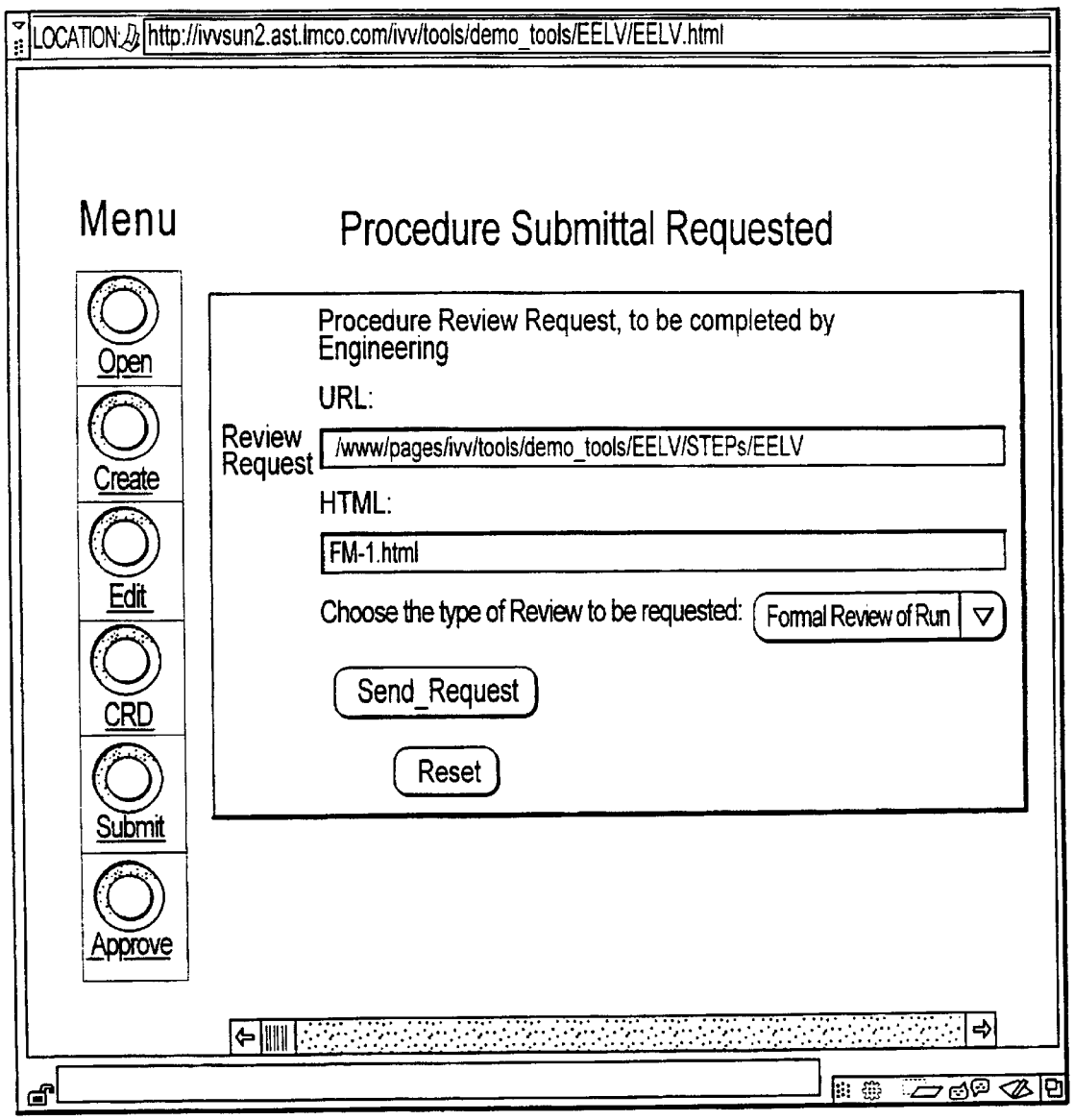
FIG. 34 discloses the display page presented when the approve function is selected.
Figure 35:
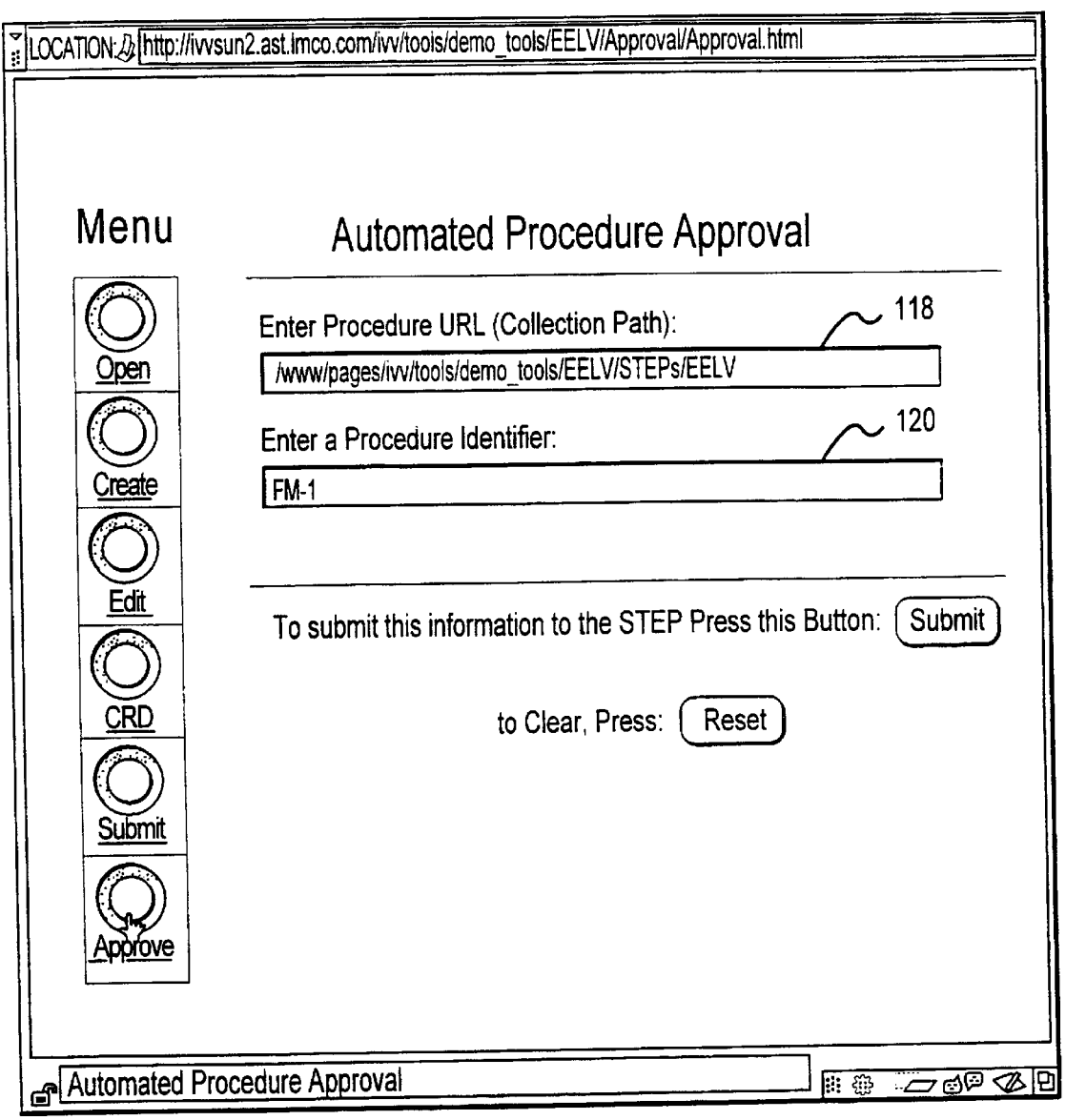
FIG. 35 discloses a display presented for approving a submitted procedure.

Returning again to FIG. 2, the system user upon the creation of a new procedure may either wish to, or be required to, have the procedure reviewed and approved by others. Upon selection of the submit button 38 the display screen disclosed in FIG. 32 is presented. In order to initiate the submittal process the system user first enters the path for the new procedure in dialog box 114 and any identifiers in procedure box 116. This information may then be submitted to the system. Upon submittal of the selected test procedure, the steps disclosed in the flowchart of FIG. 33 are performed. Initially an analysis is performed as to whether the STEP exists in the system. Once it is identified, all the relevant information as to the procedure are attached and it may them be submitted to a roster of individuals, whose contact information is stored in memory. Notice may be sent out to reviewers via automated E-mail. Access may be gained to the test procedure through the parties acting as system users. They may then use the pathname or identifier to locate and view the particular procedure.

Following the creation of the test procedure and acceptance and approval to execute the procedure, a test engineer may open the procedure for execution. The system user may first select the open button 30 and view the directory shown in FIG. 3. Upon selection of the desired STEP, and design section within a step, a screen display will provided through which information relating to the test may be entered. Disclosed in FIG. 37 is screen display for design section 3.0. The system user may enter the information associated with the test. By setting up the H/W and S/W environment, using the defined data, following all prescribed steps in the procedural section the user is assured of execution in a known environment. The procedure execution is documented by clicking the appropriate boxes by the action/response and entering any flag/notes.

Upon selection of the section 3.0 submit button a time tagged report is generated for future review and acceptance. All electronic attachments are hyperlinked and the procedure reviewed by SQA, engineering, and management. Following review, the directory containing the procedure and all attachments is locked up to prevent inadvertent changes to the procedure and to assure repeatability and accountability of the procedure and contents.

Following the execution of the STEP there may be many attachments associated with the STEP that are needed to document or reproduce the run which aids both regression testing as well as audits. These files can be hyperlinked to the STEP by automated forms in Section 4.0 attachments, if appropriate. Automated mail may then be used to contact other parties to review the results of the STEP. The STEP can be reviewed by any number of users in tandem and reviews returned to the party performing the test.

The STEP, all associated mail correspondence, attachments, output files, etc. may be retained and/or archived for future reference and use in regression testing. Each test is then repeatable with a known environment, inputs, test procedures and expected results.

The foregoing description of the present invention has been presented for purposes of illustration and description. Furthermore, the description is not intended to limit the invention to the form disclosed herein. Consequently, variations and modifications commensurate with the above teachings, and the skill or knowledge of the relevant are, within the scope of the present invention. The embodiments described hereinabove are further intended to explain best modes known for practicing the invention and to enable others skilled in the art to utilize the invention in such, or other, embodiments and with various modifications required by the particular applications or uses of the present invention. It is intended that the appended claims be construed to include alternative embodiments to the extent permitted by the prior art.

What is claimed is:

1. A system for automated generation of procedures comprising:
   a processing apparatus connectable to a data network, said processing apparatus comprising:
      a database which includes a plurality of sub-procedures relating to a specific process or apparatus;
      a plurality of interface displays which may be presented to at least one user interface which has established a connection with processing apparatus over the data network, where the plurality of interface devices provide for the entry, viewing, and/or manipulation of information;
      a procedure creating module which generates procedures in response to the information received through the use of the at least one interface device; and said processing apparatus further including at least one of:
         a procedure opening module which opens and displays procedures stored in the database;
         a procedure editing module which in response to directional information received through the interface devices edits selected numbers of the procedures in the database;
         a module to copy, rename, or delete selected numbers of the procedures in response to the directional information received through the interface devices;
         a submittal module which in response to the directional information submits at least one of the procedures stored in database to an approval process; and
      an approval module which in response to the directional information may retrieve at least one of the procedures from the database and perform an approval process.

2. The system of claim 1 wherein the processing apparatus is a network server connected to the worldwide web.

3. The system of claim 1 wherein the procedure creating module is employed to create custom procedures, and a plurality of the interfaces are displayed to receive information relating to:
   items to be tested and an environment in which the procedure is to be employed;
   sources of data to be employed during execution of the custom procedure;
   steps to be performed and results expected from the custom procedure; and
   attachments relating to execution of the custom procedure.

4. The system of claim 3 wherein pre-existing templates are included in the custom procedure.

5. The system of claim 3 wherein the procedures are created using HTML.

6. The system of claim 5 wherein the creation module automatically catenates the information received to create the custom process as a single HTML document.

7. The system of claim 1 wherein the procedure creating module combines pre-existing templates stored in memory to create a new one of the procedures.

8. The system of claim 1 wherein the procedures are created using hypertext markup language (HTML).

9. The system of claim 1 wherein the interfaces devices are screen displays accessible over the data network and created using HTML.

10. The system of claim 1 wherein the procedures stored in the memory may be accessed and executed remotely over the data network.

11. The system of claim 10 wherein additional interfaces are provide for entry of information relating to steps performed during execution of a procedure.

12. The system of claim 1 wherein the procedures relate to testing.

13. A method for automatically generating procedures, comprising the steps of:
   detecting a connection established over a data network;
   displaying a plurality of interfaces which includes at least one dialog box through which information relating to the procedures to be generated may be entered;
   initiating a create function in response to information received through the at least one dialog box;
   based on the information received, compiling and automatically creating at least one of the procedures; and,
   the method further including at least one of the following steps:
      based on information received, opening and displaying at least one of the procedures;
      based on information received, opening and editing at least one of the procedures;
      based on information received, copying, renaming, or deleting at least one of the procedures;
      based on information received, submitting at least one of the procedures to an approval process; and
      based on information received, accessing and displaying at least one of the test procedures for approval.

14. The method of claim 13 further comprising the step of identifying and storing in memory the created procedures.

15. The method of claim 13 wherein the create function is employed to create a custom procedure including at least one of the following sections:
   items to be tested and an environment in which the procedure is to be employed;
   sources of data to be employed during execution of the custom procedure;
   steps to be performed and results expected from the custom procedure; and
   attachments relating to execution of the custom procedure.

16. The method of claim 15 wherein information from at least one pre-existing template is employed in creation of the custom procedure.

17. The method of claim 13 wherein at least one pre-existing template is used in the creation of the procedure.

18. The method of claim 13 wherein the procedures are created as HTML documents.

19. The method of claim 18 wherein the interfaces are screen displays created from HTML documents.

20. The method of claim 18 wherein the procedures include hypertext links to other selected HTML documents.

21. The method of claim 13 further comprising the step of accessing and executing the procedures through the connection established over the data network.

22. The method of claim 21 wherein information is received during the execution of the procedures relating to steps performed during the execution of the procedure.

23. The method of claim 13 wherein the procedures relate to testing.

24. A system for automated generation of procedures comprising:
   a processing apparatus connectable to a data network, said processing apparatus comprising:
      a database which includes a plurality of sub-procedures relating to a specific process or apparatus;
      a plurality of interface displays which may be presented to at least one user interface which has established a connection with processing apparatus over the data network, where the plurality of interface devices provide for the entry, viewing, and/or manipulation of information; and
      a procedure creating module which generates custom procedures in response to the information received through the use of the at least one interface device, wherein the information includes at least one of: items to be tested and an environment in which the procedure is to be employed, sources of data to be employed during execution of the custom procedure, steps to be performed and results expected from the custom procedure; and attachments relating to execution of the custom procedure.

* * * * *